(12) United States Patent
Otsuka et al.

(10) Patent No.: US 8,917,338 B2
(45) Date of Patent: Dec. 23, 2014

(54) SOLID-STATE IMAGING DEVICE, MANUFACTURING METHOD THEREOF, AND ELECTRONIC APPARATUS

(75) Inventors: Yoichi Otsuka, Kanagawa (JP); Akiko Ogino, Kumamoto (JP)

(73) Assignee: Sony Corporation, Tokyo (JP)

( * ) Notice: Subject to any disclaimer, the term of this patent is extended or adjusted under 35 U.S.C. 154(b) by 483 days.

(21) Appl. No.: 13/317,465

(22) Filed: Oct. 19, 2011

(65) Prior Publication Data

US 2012/0147208 A1  Jun. 14, 2012

(30) Foreign Application Priority Data

Dec. 9, 2010  (JP) ................................. 2010-274895

(51) Int. Cl.
| | | |
|---|---|---|
| *H04N 3/14* | (2006.01) | |
| *H04N 5/335* | (2011.01) | |
| *H04N 9/04* | (2006.01) | |
| *H01L 21/00* | (2006.01) | |
| *H04N 9/64* | (2006.01) | |
| *H01L 27/146* | (2006.01) | |

(52) U.S. Cl.
CPC .... *H01L 27/14629* (2013.01); *H01L 27/14687* (2013.01); *H01L 27/1464* (2013.01); *H01L 27/14623* (2013.01); *H01L 27/14621* (2013.01); *H01L 27/14685* (2013.01)
USPC ............................ 348/272; 348/245; 257/447

(58) Field of Classification Search
None
See application file for complete search history.

(56) References Cited

U.S. PATENT DOCUMENTS

| | | | | |
|---|---|---|---|---|
| 8,222,705 B2 * | 7/2012 | Ogino et al. | .................. | 257/396 |
| 2009/0250778 A1 * | 10/2009 | Shimotsusa | .................. | 257/432 |
| 2010/0164039 A1 * | 7/2010 | Song | .............................. | 257/432 |
| 2010/0201834 A1 * | 8/2010 | Maruyama et al. | ......... | 348/222.1 |
| 2010/0244167 A1 * | 9/2010 | Konno | ........................... | 257/432 |
| 2011/0121420 A1 * | 5/2011 | Yang | .............................. | 257/432 |

FOREIGN PATENT DOCUMENTS

| | | |
|---|---|---|
| JP | 4165077 | 6/1992 |
| JP | 07-045805 | 2/1995 |
| JP | 09-008261 | 1/1997 |

\* cited by examiner

*Primary Examiner* — Albert Cutler
(74) *Attorney, Agent, or Firm* — Rader, Fishman & Grauer PLLC

(57) ABSTRACT

A solid-state imaging device includes a light blocking layer formed in an active pixel region of a pixel region on a light incident side so as to surround a photoelectric conversion unit of each pixel and formed in an extending manner to an optical black region, a concave portion formed so as to be surrounded by the light blocking layer in a region corresponding to the photoelectric conversion unit, a first refractive index layer formed on surfaces of the light blocking layer and the concave portion and having a relatively low refractive index, a second refractive index layer formed on the first refractive index layer so as to be buried in the concave portion and having a relatively high refractive index, and an anti-flare layer formed on the first refractive index layer in the optical black region.

19 Claims, 27 Drawing Sheets

FIG. 6
FIG. 6A
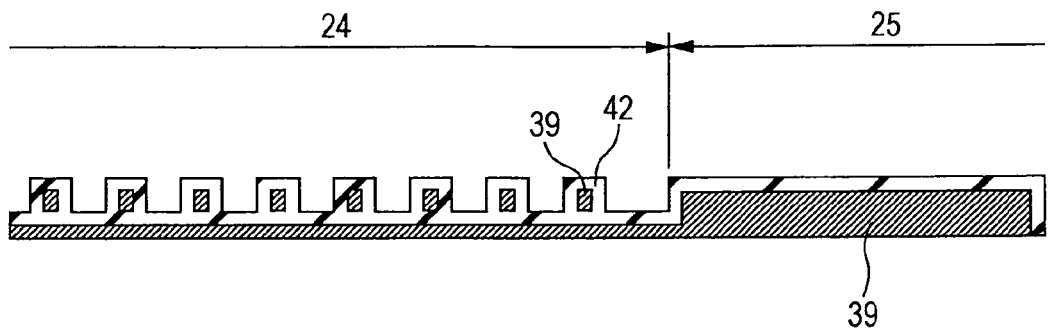
FIG. 6B
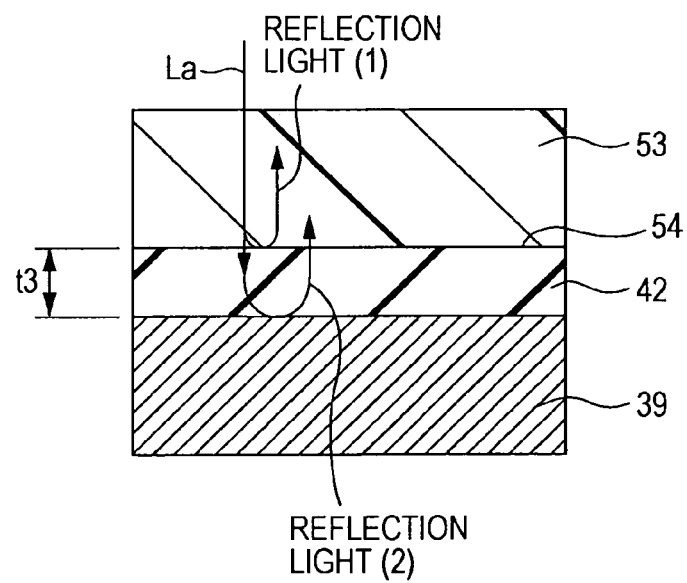

SOLID-STATE IMAGING DEVICE, MANUFACTURING METHOD THEREOF, AND ELECTRONIC APPARATUS

BACKGROUND

The present disclosure relates to a solid-state imaging device and a manufacturing method thereof, and an electronic apparatus such as a camera having the solid-state imaging device.

There is a CCD solid-state imaging device or a CMOS solid-state imaging device as a solid-state imaging device (image sensor). The solid-state imaging device is used for digital still cameras, digital video cameras, and various portable terminal apparatuses such as mobile phones with cameras.

In recent years, a rear surface irradiation type CMOS solid-state imaging device has been used as a solid-state imaging device for improving sensitivity. FIG. 28 shows an example of main parts of the rear surface irradiation type CMOS solid-state imaging device. The rear surface irradiation type CMOS solid-state imaging device 1 is provided with a thinned semiconductor substrate 2 where photodiodes PD which are a photoelectric conversion unit are formed from the front surface to the rear surface and a plurality of pixel transistors forming pixels are formed on the front surface side. In the figure, each of the plurality of pixel transistors is represented by a transmission transistor Tr1 having a transmission gate electrode 3. A multi-layer wire layer 6 where a plurality of wires 5 are disposed is formed on the front surface of the semiconductor substrate 2 via an interlayer insulating layer 4, and a supporting substrate 8 is joined to the multi-layer wire layer 6 via an adhesive layer 7. A planarization film 10 is formed on the rear surface of the semiconductor substrate 2 via an insulating layer 9 formed of a plurality of layers, and on-chip color filters (hereinafter, referred to as color filters) 11 and on-chip micro lenses (hereinafter, referred to as micro lenses) 12 are formed on the planarization film 10.

On the other hand, Japanese Unexamined Patent Application Publication No. 9-8261 discloses a solid-state imaging device where a passivation film and a transparent dielectric film having a refractive index higher than the passivation film formed thereon are formed in a light incident opening surrounded by light blocking layers at the upper side of photodiodes. The passivation film is made of a NSG film, a PSG film, or the like, and the transparent dielectric film is made of an acrylate resin. In this solid-state imaging device, light incident to the passivation film can be collected at the photodiodes.

In order to improve light collecting efficiency at a photodiode, solid-state imaging devices with a waveguide structure built therein are disclosed in Japanese Unexamined Patent Application Publication No. 7-45805 and Japanese Patent No. 4165077.

SUMMARY

The rear surface irradiation type CMOS solid-state imaging device may have a configuration in which, as shown in FIG. 29, a light blocking layer 13 is provided on the insulating film 9 of the rear surface side of the semiconductor substrate 2 so as to block light from entering between the pixels by surrounding the photodiodes PD of the respective pixels. The light blocking layer 13 is made of, for example, a metal film. As the remaining configurations of the solid-state imaging device 14 in FIG. 29 are the same as in FIG. 28, the same reference numerals are given to the parts corresponding to FIG. 28, and repeated description will be omitted.

FIGS. 30 to 32 show an outline of the light path of light beams incident via the micro lens 12 in the solid-state imaging device 1 in FIG. 28 and in the solid-state imaging device 14 having the light blocking layer 13 between the pixels in FIG. 29. In the solid-state imaging device 1, as shown in FIG. 30, as the incident light beams L are incorporated in the photodiodes PD more, the sensitivity characteristic of the device is improved. However, a portion of the incident light beams is incorporated in the photodiodes PD of the adjacent pixels, and this is a cause of color mixing.

As shown in FIGS. 31 and 32, since the light blocking layers 13 are installed between the pixels in the solid-state imaging device 14, the light blocking layer 13 prevents incident light from entering the adjacent pixels, thereby suppressing color mixing. However, a portion of the incident light beams L is blocked by the light blocking layers 13, and thus the sensitivity characteristic is reduced. The sensitivity and color mixing have a trade-off relationship.

In addition, a solid-state imaging device 15 is also considered in which the light blocking layer 13 is provided, the planarization film 10 or the color filter 11 under the micro lens 12 is thinned, and a curvature radius is optimized so as to be suitable for the thinning (FIG. 32). As shown in FIG. 32, since the distance between the micro lens 12 and the photodiode PD becomes short in the solid-state imaging device 15, expansion of incident light in the cross-sectional direction is reduced, and thus the incident light is incorporated in the photodiodes PD of the respective pixels. Therefore, when this configuration is employed, the sensitivity characteristic of the device and color mixing can be improved. However, it is necessary to planarize step differences in regions other than an active pixel region or to sufficiently secure uniformity of the film thickness of the color filter, and thus the thinning has a limit.

On the other hand, in the solid-state imaging device, the light blocking layers are formed between the pixels in the active pixel region, and the light blocking layers are also installed in a pixel region for obtaining a reference of an optical black level, that is, an optical black region. In addition, it has been attempted to form an anti-flare layer for preventing flare on the light blocking layers in the optical black region. The anti-flare layer uses a photosensitive film, and may be formed using, for example, a color filter. However, it is difficult to directly form the anti-flare layer on the light blocking layer which is made of a metal film. When the negative type photosensitive film on the metal light blocking layer is exposed with single color light (for example, i rays), sufficient exposure is not performed due to the standing wave effect caused by interference between the exposure light and light reflected from the light blocking layer interface, and thus the anti-flare layer is not adhered onto the light blocking layer.

Generally, when color filters are formed in the pixel portion, the anti-flare layer is formed in the optical black B portion using green, red, and blue filters along with the formation of the color filters.

It is desirable to provide a solid-state imaging device and a manufacturing method, capable of improving a photosensitivity characteristic (hereinafter, referred to as sensitivity characteristic) and a shading characteristic, and further enabling an anti-flare layer to be formed on a light blocking layer in an optical black region.

In addition, it is desirable to provide an electronic apparatus such as a camera having the solid-state imaging device.

A solid-state imaging device according to an embodiment of the present disclosure includes a light blocking layer that is formed in an active pixel region of a pixel region in a light incident side so as to surround a photoelectric conversion unit of each pixel and is formed in an extending manner to an optical black region; a concave portion that is formed so as to be surrounded by the light blocking layer in a region corresponding to the photoelectric conversion unit; a first refractive index layer that is formed on surfaces of the light blocking layer and the concave portion and has a relatively low refractive index; a second refractive index layer that is formed on the first refractive index layer so as to be buried in the concave portion and has a relatively high refractive index; and an anti-flare layer that is formed on the first refractive index layer in the optical black region, wherein an internal light collecting body is formed by the light blocking layer, the first refractive index layer, and the second refractive index layer in the active pixel region.

In the solid-state imaging device according to the embodiment of the present disclosure, the first refractive index layer having a relatively low refractive index is formed on the surfaces of the light blocking layer and the concave portion, and the second refractive index layer having a relatively high refractive index is formed so as to be buried in the concave portion in the active pixel region. Since the internal light collecting body is formed by the light blocking layer, the first refractive index layer, and the second refractive index layer, light which is obliquely incident to the internal light collecting body is reflected at the interface between the first refractive index layer and the second refractive index layer or reflected at the interface between the light blocking layer and the first refractive index layer, and is incident toward the photoelectric conversion unit. In the optical black region, the first refractive index layer is formed on the light blocking layer in an extending manner, thereby forming the anti-flare layer on the first refractive index layer. Therefore, the anti-flare layer has good adhesion.

A manufacturing method of a solid-state imaging device according to another embodiment of the present disclosure includes forming a light blocking layer in an active pixel region of a pixel region in a light incident side so as to surround a photoelectric conversion unit of each pixel and in an extending manner to an optical black region; forming a concave portion so as to be surrounded by the light blocking layer in a region corresponding to the photoelectric conversion unit; forming a first refractive index layer having a relatively low refractive index on surfaces of the light blocking layer and the concave portion; forming a second refractive index layer having a relatively high refractive index on the first refractive index layer so as to be buried in the concave portion; and forming an anti-flare layer on the first refractive index layer in the optical black region, wherein an internal light collecting body is formed by the light blocking layer, the first refractive index layer, and the second refractive index layer in the active pixel region.

In the manufacturing method of the solid-state imaging device according to the embodiment of the present disclosure, the first refractive index layer having a relatively low refractive index is formed on the surfaces of the light blocking layer and the concave portion, and the second refractive index layer having a relatively high refractive index is formed on the first refractive index layer so as to be buried in the concave portion. Since the internal light collecting body is formed by the first refractive index layer and the second refractive index layer, light which is obliquely incident to the internal light collecting body is reflected at the interface between the first refractive index layer and the second refractive index layer or reflected at the interface between the light blocking layer and the first refractive index layer, and is incident toward the photoelectric conversion unit. In the optical black region, the first refractive index layer is formed on the light blocking layer in an extending manner, thereby forming the anti-flare layer on the first refractive index layer. Therefore, the anti-flare layer has good adhesion.

An electronic apparatus according to still another embodiment of the present disclosure includes a solid-state imaging device; an optical system that guides incident light to a photoelectric conversion unit of the solid-state imaging device; and a signal processing circuit that processes an output signal from the solid-state imaging device. The solid-state imaging device is configured by the above-described solid-state imaging device.

Since the electronic apparatus according to the embodiment of the present disclosure has the solid-state imaging device, light which is obliquely incident to the internal light collecting body is reflected at the interface between the first refractive index layer and the second refractive index layer or reflected at the interface between the light blocking layer and the first refractive index layer, and is incident toward the photoelectric conversion unit. In the optical black region, the first refractive index layer is formed on the light blocking layer in an extending manner, thereby forming the anti-flare layer on the first refractive index layer. Therefore, the anti-flare layer has good adhesion.

According to the solid-state imaging device related to the embodiment of the present disclosure, it is possible to improve a sensitivity characteristic and a shading characteristic. Further, it is possible to form an anti-flare layer having good adhesion in an optical black region.

According to the manufacturing method of the solid-state imaging device related to the embodiment of the present disclosure, it is possible to manufacture a solid-state imaging device which can improve a sensitivity characteristic and a shading characteristic, and which includes an anti-flare layer having good adhesion in an optical black region.

According to the electronic apparatus related to the embodiment of the present disclosure, it is possible to provide an electronic apparatus with high image quality, capable of improving a sensitivity characteristic and a shading characteristic and of preventing flare.

BRIEF DESCRIPTION OF THE DRAWINGS

FIG. 6 is a diagram illustrating a standing effect during exposure when an anti-flare layer is formed in an optical black region according to an embodiment of the present disclosure.

DETAILED DESCRIPTION OF EMBODIMENTS

Hereinafter, embodiments of the present disclosure will be described. The description will be made in the following order.

1. FIRST EMBODIMENT (CONFIGURATION EXAMPLE AND MANUFACTURING METHOD EXAMPLE OF SOLID-STATE IMAGING DEVICE)
2. SECOND EMBODIMENT (CONFIGURATION EXAMPLE AND MANUFACTURING METHOD EXAMPLE OF SOLID-STATE IMAGING DEVICE)
3. THIRD EMBODIMENT (CONFIGURATION EXAMPLE AND MANUFACTURING METHOD EXAMPLE OF SOLID-STATE IMAGING DEVICE)
4. FOURTH EMBODIMENT (CONFIGURATION EXAMPLE AND MANUFACTURING METHOD EXAMPLE OF SOLID-STATE IMAGING DEVICE)
5. FIFTH EMBODIMENT (CONFIGURATION EXAMPLE AND MANUFACTURING METHOD EXAMPLE OF SOLID-STATE IMAGING DEVICE)
6. SIXTH EMBODIMENT (CONFIGURATION EXAMPLE AND MANUFACTURING METHOD EXAMPLE OF SOLID-STATE IMAGING DEVICE)
7. SEVENTH EMBODIMENT (CONFIGURATION EXAMPLE OF SOLID-STATE IMAGING DEVICE)
8. EIGHTH EMBODIMENT (CONFIGURATION EXAMPLE OF SOLID-STATE IMAGING DEVICE)
9. NINTH EMBODIMENT (CONFIGURATION EXAMPLE OF SOLID-STATE IMAGING DEVICE)
10. TENTH EMBODIMENT (CONFIGURATION EXAMPLE OF SOLID-STATE IMAGING DEVICE)
11. ELEVENTH EMBODIMENT (CONFIGURATION EXAMPLE OF ELECTRONIC APPARATUS)

1. First Embodiment

Configuration Example of Solid-State Imaging Device

Figure 1:
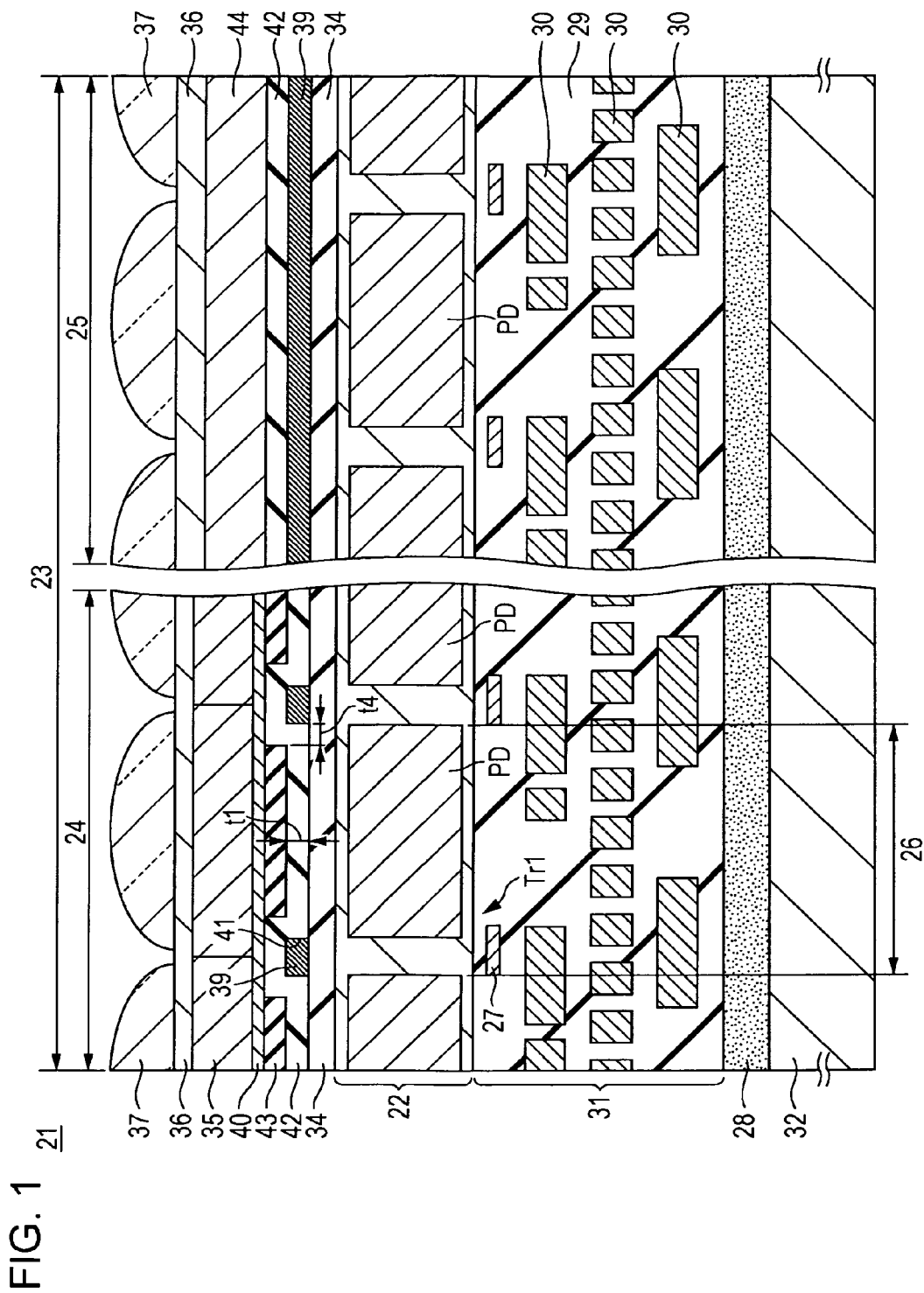
FIG. 1 is a schematic configuration diagram of main parts of a solid-state imaging device according to a first embodiment of the present disclosure.

FIG. 1 shows a solid-state imaging device according to a first embodiment of the present disclosure. The solid-state imaging device according to the embodiment employs a rear surface irradiation type CMOS solid-state imaging device. The solid-state imaging device 21 according to the first embodiment has a pixel region 23 where a plurality of pixels 26 including photodiodes PD which are photoelectric conversion units and a plurality of pixel transistors are arranged in a two-dimensional manner on a thinned, for example, silicon semiconductor substrate 22. The pixel region 23 includes an active pixel region 24, and a so-called optical black region 25, which is a pixel region used as a reference of an optical black level outside the active pixel region 24.

The pixel 26 may be formed as a unit pixel by the photodiode PD and a plurality of pixel transistors. In addition, the pixel 26 may have a shared pixel structure. The shared pixel structure includes a plurality of photodiodes PD, a plurality of transmission transistors, a shared floating diffusion, and another shared pixel transistor. The plurality of pixel transistors (MOS transistors) may be constituted by, for example, three transistors of a transmission transistor, a reset transistor, and an amplifying transistor. In addition, the plurality of pixel transistors may be constituted by four transistors by further including a selection transistor. In FIG. 1, the plurality of pixel transistors are represented by a transmission transistors Tr1 having a transmission gate electrode 27.

The photodiode PD is formed from the front surface side of the semiconductor substrate 22 to the rear surface side thereof. The pixel transistors are formed on the front surface side of the semiconductor substrate 22. A multi-layer wire layer 31 where a plurality of wire layers 30 are disposed via an interlayer insulating film 29 are formed on the front surface side of the semiconductor substrate 22, and a supporting substrate 32 formed from, for example, a silicon substrate is joined to the multi-layer wire layer 31. The multi-layer wire layer 31 and the supporting substrate 32 may be joined to each other via, for example, an adhesive layer 28.

An insulating film 34 formed of a single layer or a plurality of layers is formed on the rear surface side of the semiconductor substrate 22 which is a light incidence side. On the insulating film 34, on-chip color filters (hereinafter, referred to as color filters) 35, a planarization film 36, and on-chip micro lenses (hereinafter, referred to as micro lenses) 37 are formed. The insulating film 34 may be formed as an anti-reflection film made of, for example, a silicon oxide film, a hafnium oxide film, or the like.

In addition, in the embodiment, a light blocking layer 39 is formed on the insulating film 34 in the active pixel region 24 and the optical black region 25 of the pixel region 23. The light blocking layer 39 is formed so as to surround the photodiodes PD of the respective pixels in the active pixel region 24, and the light blocking layer 39 which is the same film extending from the light blocking layer 39 in the active pixel region 24 is formed on the entire surface in the optical black region 25. In the active pixel region 24, a concave portion 41 surrounded by the light blocking layer 39 is formed in a region corresponding to each photodiode PD. As the light blocking layer 39, for example, a single film such as Al, Cu or W, or a metal film such as an alloy film thereof is used.

A first refractive index layer 42 having a relatively low refractive index is formed on the surfaces of the light blocking layer 39 and the concave portions 41 from the active pixel region 24 to the optical black region 25. As a material of the first refractive index layer 42, for example, a silicon oxide film, a silicon carbide oxide film, a magnesium fluoride film, a calcium fluoride film, or the like is used.

In the active pixel region 24, a second refractive index layer 43 which has a refractive index higher than the first refractive index layer 42 is formed on the first refractive index layer 42 so as to be buried in the concave portion 41. In this example, the light blocking layer 39 is formed to be buried in the second refractive index layer 43 and thus the surface of the second refractive index layer 43 is planarized. As a material of the second refractive index layer 43, for example, a silicon nitride film, a silicon nitride oxide film, or the like is used. That is to say, in relation to the magnitude correlation of the refractive index, the first refractive index layer 42 is lower than the second refractive index layer 43. The light blocking layer 39, the first refractive index layer 42, and the second refractive index layer 43 form an internal light collecting body so as to correspond to the photodiode PD of each pixel. The color filters 35 are formed on the second refractive index layer 43 via the planarization film 40. The planarization film 40 has a refractive index lower than the second refractive index layer 43.

On the other hand, in the optical black region 25, an anti-flare layer 44 for preventing flare is formed on the light blocking layer 39 which is formed on the entire surface. The anti-flare layer 44 is formed through an exposure process using a photosensitive film. The anti-flare layer 44 may use, for example, a photosensitive film (for example, only a blue filter, or a combination of red, green, and blue filters) such as the color filter in the active pixel region 24, a photosensitive carbon black film, a photosensitive titanium black film, or the like.

The film thickness t4 (the film thickness of the side wall side of the light blocking layer) of the first refractive index layer 42 is preferably 50 nm or more to 200 nm below (50 nm≤t4<200 nm). The film thickness t1 of the first refractive index layer 42 of the concave portion bottom corresponding to the photodiode PD is about 1.5 times the film thickness t4. If the film thickness t4 is in a range of 50 nm≤t4<200 nm, as described above, it is possible to improve the sensitivity characteristic and the shading characteristic, and further to form the anti-flare layer 44 having good adhesion on the optical black region 25.

In the solid-state imaging device 21, a color filter center and a micro lens center are preferably shifted toward the center of the pixel region gradually or in a stepwise manner with respect to a center of the photodiode PD according to movement to the edges of the pixel region 23, in the same manner as a typical case. The shift amount may be the same in the color filter and the micro lens, or may be larger in the micro lens. With this configuration, it is possible to heighten sensitivity, and to reduce occurrence of color mixing and luminance shading.

Modified Example of Solid-State Imaging Device

In FIG. 1, although the planarization film 40 is formed on the second refractive index layer 43 of the active pixel region 24, in principle, the planarization film 40 may be omitted and the color filters 35 may be directly formed on the second refractive index layer 43.

Manufacturing Method Example of Solid-State Imaging Device

FIGS. 2A to 3C show a manufacturing method example of the solid-state imaging device 21 according to the first embodiment. First, although not shown in detail, for example, the photodiodes PD of the respective pixels are formed in the pixel region 23 of the silicon semiconductor substrate 22, and a plurality of pixel transistors of the respective pixels are formed on the front surface side of the semiconductor substrate. The pixels are formed in the active pixel region 24 and the optical black region 25. Next, the multi-layer wire layer is formed by disposing a plurality of wire layers on the front surface of the semiconductor substrate 22 via the interlayer insulating film. Thereafter, a supporting substrate, for example, a silicon substrate is joined to the surface of the multi-layer wire layer, and then the semiconductor substrate 22 is thinned through grinding, polishing, and the like, such that the photodiodes PD approach the rear surface.

Figure 2A:
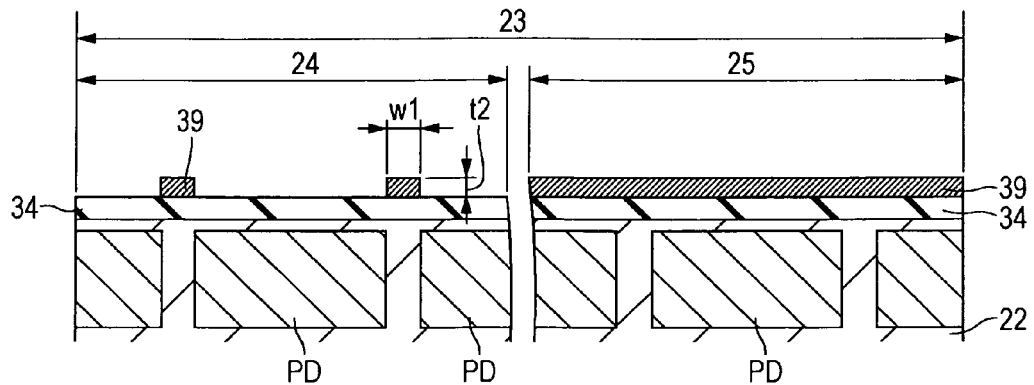
FIGS. 2A to 2C are manufacturing process diagrams (first) illustrating a manufacturing method example of the solid-state imaging device according to the first embodiment.

Next, as shown in FIG. 2A, the insulating film 34 formed of a single layer or a plurality of layers is formed in the pixel region 23 of the semiconductor substrate 22. The insulating film 34 may be formed as an anti-reflection film using a silicon oxide film, a hafnium oxide film, or the like. Next, the light blocking layer 39 is formed on the entire surface of the active pixel region 24 and the optical black region 25, and the light blocking layer 39 is patterned through photolithography and dry etching. Thereby, the light blocking layer 39 which blocks light from entering between the pixels is formed in the active pixel region 24 so as to surround each of the photodiodes PD and to form the concave portion 41 in the region corresponding to each of the photodiodes PD. At the same time, the light blocking layer 39 which extends from the light blocking layer 39 in the active pixel region 24 and blocks light from entering the entire surface of the optical black region 25 is formed. The light blocking layer 39 may be formed using, for example, a single film such as Al, Cu or W, or a metal film such as an alloy film thereof. The film thickness t2 of the light blocking layer 39 is preferably about 100 nm to 500 nm so as to achieve a light blocking effect as in a small state as possible. The line width w1 of the light blocking layer 39 in the active pixel region 24 is preferably equal to or less than 150 nm. The embodiment is suitable for a fine pixel having the pixel size of 1.5 square μm or less.

Figure 2B:
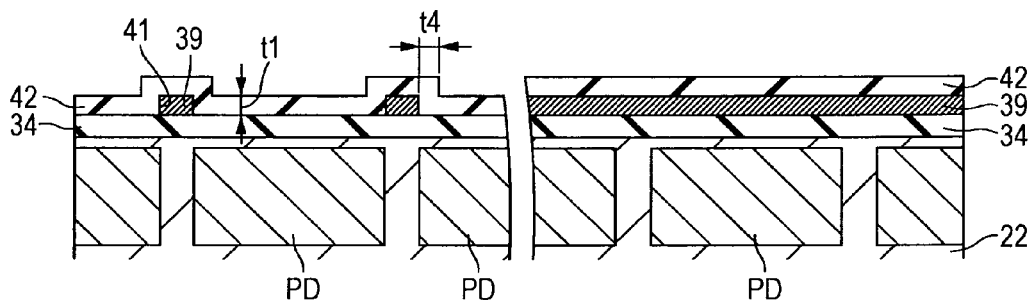

Next, as shown in FIG. 2B, the first refractive index layer 42 having a relatively low refractive index is formed on the entire surface of the active pixel region 24 and the optical black region 25 so as to cover the surfaces of the light blocking layer 39 and the concave portions 41. As described above, the first refractive index layer 42 may use a silicon oxide film, a silicon carbide oxide film, a magnesium fluoride film, a calcium fluoride film, a lithium fluoride film, or the like. Such a film may be formed using a film forming method such as a CVD method, a sputtering method, an ion plating method, and a vapor deposition polymerization method which are of a dry type. The film thickness t4 of the first refractive index layer 42 is equal to or more than 50 nm to less than 150 nm.

Figure 2C:
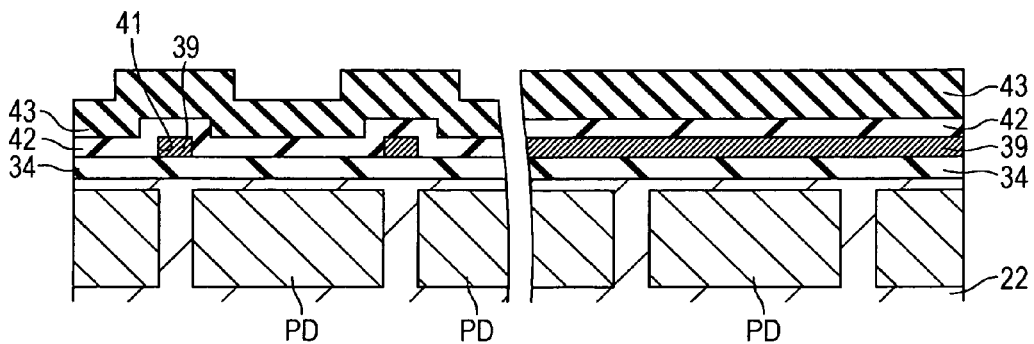

Next, as shown in FIG. 2C, the second refractive index layer 43 having a refractive index higher than the first refractive index layer 42 is formed on the first refractive index layer 42 in the active pixel region 24 and the optical black region 25. As described above, the second refractive index layer 43 may use a silicon nitride film, a silicon nitride oxide film, or the like.

Figure 3A:
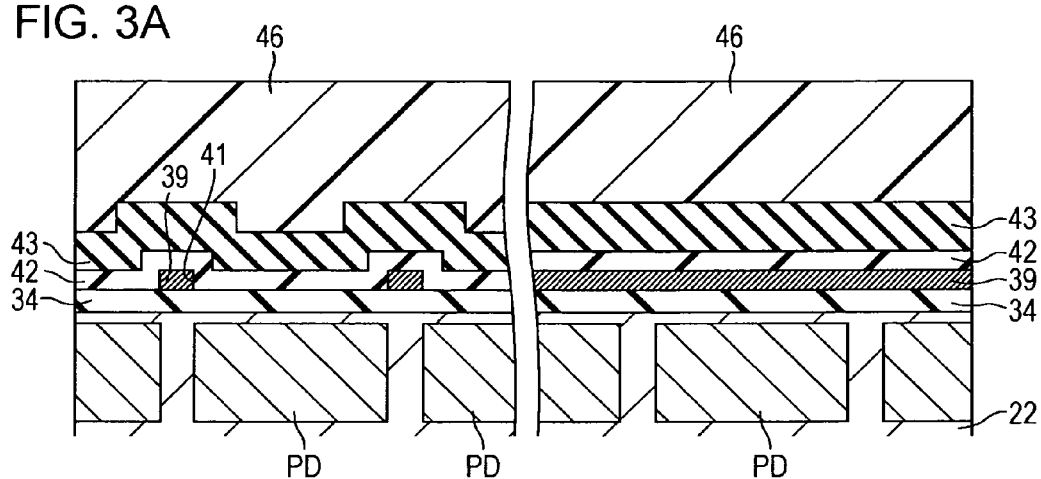
FIGS. 3A to 3C are manufacturing process diagrams (second) illustrating a manufacturing method example of the solid-state imaging device according to the first embodiment.

Next, as shown in FIG. 3A, a necessary resin layer 46 is coated on the second refractive index layer 43. The resin layer 46 is coated such that the surface thereof is substantially planarized. The resin layer 46 may use, for example, a novolac resin, a polystyrene resin, a copolymer resin thereof, or the like.

Figure 3B:
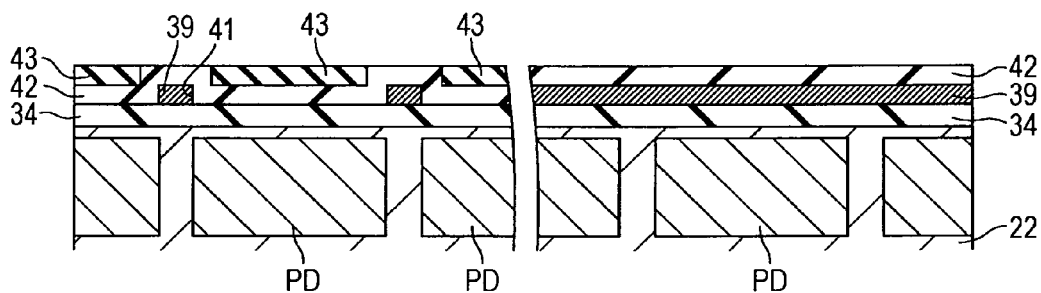

Next, as shown in FIG. 3B, the resin layer 46 is entirely etched back from the upper surface thereof in the active pixel region 24 and the optical black region 25 using a reactive ion etching (RIE) method or the like. In the active pixel region 24, the surface of the second refractive index layer 43 which has unevenness is planarized. Alternatively, the unevenness of the surface of the second refractive index layer is reduced. In the active pixel region 24, an internal light collecting body is formed by the light blocking layer 39, the first refractive index layer 42, and the second refractive index layer 43, so as to correspond to the photodiode PD of each pixel. On the other hand, in the optical black region 25, the overall second refractive index layer 43 is removed, and thus the first refractive index layer 42 is exposed to the front surface. The etch-back process is performed by using the first refractive index layer 42 as a detector of an etching end point or a polishing stopper of CMP (Chemical Mechanical Polishing). In FIG. 3B, the second refractive index layer 43 is etched back up to the surface of the first refractive index layer 42. In the active pixel region 24, the second refractive index layer 43 may be left on the first refractive index layer 42. This may be applied to the following embodiments.

Figure 3C:
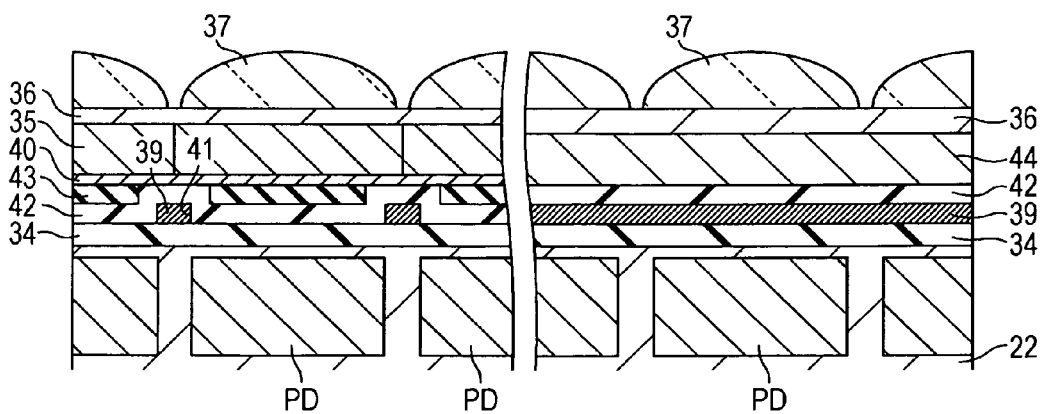

Next, as shown in FIG. 3C, the planarization film 40 having a refractive index lower than the second refractive index layer 43 is formed on the planarized surface of the second refractive index layer 43. Then, the color filters 35 are formed on the planarization film 40 in the active pixel region 24, and the anti-flare layer 44 is formed on the first refractive index layer 42 in the optical black region 25. The anti-flare layer 44 is formed using a photosensitive film, and, for example, may be formed using a blue filter of the color filters 35, or laminated films of the entire blue filter on the lattice-shaped green filter and red filter, at the same time as the formation of the color filters 35. At this time, a color filter in the active pixel region 24 and a color filter which becomes the anti-flare layer 44 in the optical black region 25 can be simultaneously formed through exposure and development. The anti-flare layer 44 may be formed through exposure and development using a photosensitive titanium black film, a photosensitive carbon black film, or the like, in a process separated from the formation process of the color filters.

Next, the micro lenses 37 are formed on the entire surface of the active pixel region 24 and the optical black region 25 via the planarization film 36. In this way, the desired solid-state imaging device 21 is obtained in which an internal light collecting body corresponding to the photodiode PD of each pixel is formed through self-alignment with respect to the light blocking layer 39.

Modified Example of Manufacturing Method

The above-described first refractive index layer 42 having a relatively low refractive index is formed using a resin film of an acrylic resin, a silloxane resin, or the like. A lower refractive index can be obtained by adding fluorine atoms or hollow silica particles to the resin.

If a silicon nitride oxide film is selected as the first refractive index layer 42, the second refractive index layer 43 is preferably formed using a silicon nitride oxide film having a high refractive index by changing film forming conditions.

In the solid-state imaging device 21 according to the first embodiment, the internal light collecting body is constituted by the light blocking layer 39 surrounding the photodiode PD, the first refractive index layer 42, and the second refractive index layer 43 buried in the concave portion 41, on the photodiode PD of each pixel 26 in the active pixel region 24. Incident light passing through the micro lens 37 is collected by the internal light collecting body and is incident to the photodiode PD. Therefore, the sensitivity characteristic in the solid-state imaging device 21 is improved, and the shading characteristic indicating a sensitivity difference between the center and the periphery in the active pixel region 24 can be improved.

In the optical black region 25, since the anti-flare layer 44 is formed on the light blocking layer 39 using a photosensitive film via the first refractive index layer 42, adhesion of the anti-flare layer 44 is improved, and thus it is possible to form the anti-flare layer 44 having high reliability. Therefore, it is possible to provide a rear surface irradiation type CMOS solid-state imaging device with high image quality.

Figure 4:
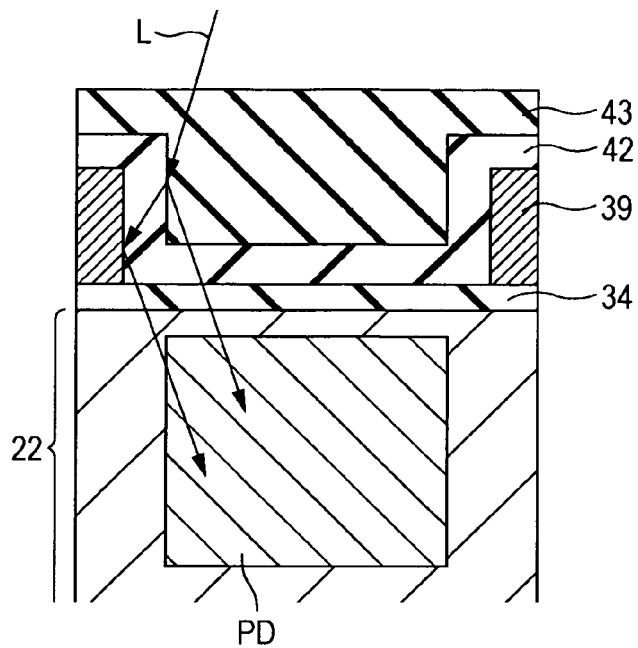
FIG. 4 is a diagram illustrating an optical waveguide effect of an internal light collecting body according to an embodiment of the present disclosure.

The internal light collecting body according to the embodiment has a waveguide function and a lens function together. A light collecting effect of the internal light collecting body will be described more in detail. FIG. 4 is a diagram illustrating the waveguide function. As shown in FIG. 4, light L incident to the second refractive index layer 43 is totally reflected at the interface between the second refractive index layer 43 and the first refractive index layer 42 having a refractive index lower than that, and then is guided to the photodiode PD. A portion of light components passing through the interface of the light L incident to the second refractive index layer 43 are reflected by the light blocking layer 39 made of a metal film and are guided to the photodiode PD. In this way, the incident light L is collected at the photodiode PD by the waveguide effect.

Figure 5:
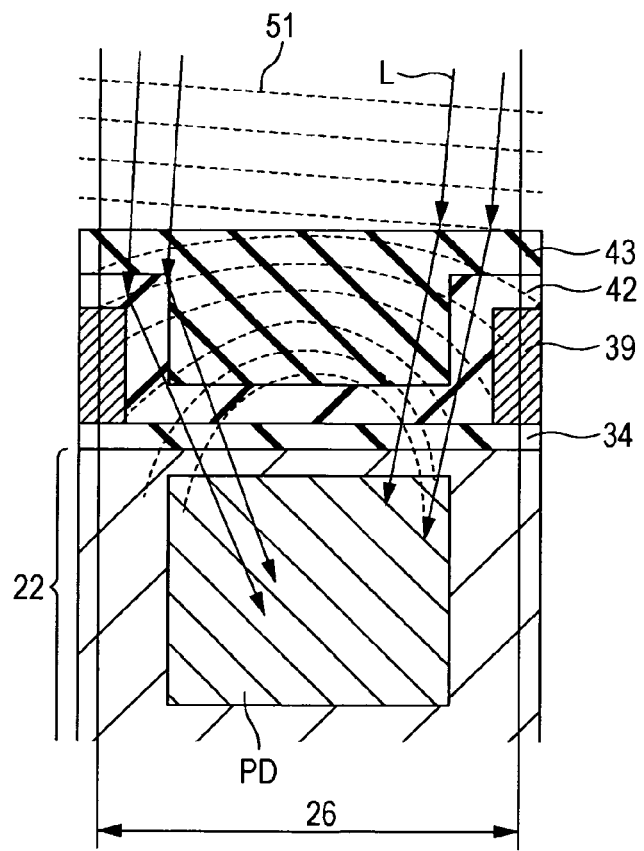
FIG. 5 is a diagram illustrating a lens effect according to an embodiment of the present disclosure.

FIG. 5 is a diagram illustrating the lens function. When a refractive index relationship between the first refractive index layer 42 and the second refractive index layer 43 is the first refractive index layer 42<the second refractive index layer 43, the wave surface 51 (denoted with broken lines) of the incident light L is shown in FIG. 5. That is to say, the wave surface 51 of the light is parallel before the incident light L enters the internal light collecting body. After the incident L enters the internal light collecting body, the traveling speed of the incident light is higher in the first refractive index layer 42 than in the second refractive index layer 43, and thus the wave surface 51 of the light is curved. In this way, the wave surface 51 of the light is curved due to the phase difference of the light based on the refractive index difference, and thereby a lens operation occurs. The incident light is collected at the photodiode PD by the lens effect.

Next, a standing wave effect which occurs due to interference between exposure light and light reflected by an internal interface influences the adhesion of the anti-flare layer 44 in the optical black region 25. This will be described with reference to FIGS. 6A and 6B. A case where, for example, a negative type photosensitive resin layer 53 is formed on the first refractive index layer 42 in the active pixel region 24 and the optical black region 25, and is irradiated with exposure light so as to form a pattern, will be verified. As shown in FIG. 6B, for example, a tungsten (W) film is used as the light blocking layer 39, for example, a silicon oxide (SiO) film is formed thereon as the first refractive index layer 42, and the negative type photosensitive resin layer 53 is formed thereon and is exposed. The exposure is performed using i rays (wavelength ($\lambda$): 365 nm). The refractive index n of the silicon oxide film is set to 1.47. The photosensitive resin layer 53 may be formed using, for example, a photosensitive resin to which pigments for a color filter are added, a transparent photosensitive resin, or the like.

When the photosensitive resin layer 53 is irradiated with exposure light La, a difference in light intensity occurs in the interface 54 due to interference between reflection light (1) reflected from an interface between the photosensitive resin layer 53 and the first refractive index layer 42 and reflection light (2) reflected from the underlying light blocking layer 39, and thereby a so-called standing wave occurs. The period T where the light intensity is the lowest in the interface 54 is expressed by the following equation.

Period: $T = \lambda/2n$ $\lambda$: wavelength of exposure light n: refractive index of the first refractive index layer If the film thickness of the first refractive index layer 42 is $\lambda/2n$, the light intensity in the interface 54 is lowest.

For example, in a case where the exposure light is i rays (wavelength: 365 nm) and the refractive index n of the silicon oxide film of the first refractive index layer 42 is set to 1.47, the film thickness t3 of the first refractive index layer 42 where the light intensity in the interface 54 is lowest is $365/(2 \times 1.47) = 124.1$ nm.

If the light intensity in the interface 54 is lowered, adhesion in the interface 54 is reduced, and thus a problem occurs such as peeling of the film when a pattern is formed on the negative type photosensitive resin layer 53.

Therefore, in order to improve the adhesion of the photosensitive resin layer which forms the anti-flare layer 44, in the above-described example, the film thickness t3 of the first refractive index layer 42 is preferably set to a value other than $\lambda/2n$.

The adhesion of the photosensitive resin layer depends on light intensity inside the photosensitive resin layer, and further may depend on a photochemical reaction generated in the photosensitive resin layer during the exposure. For example, photosensitive components in the photosensitive resin layer generate a photo radical due to the exposure, which causes the photochemical reaction to be a chain reaction, and thereby components inside the resin layer are crosslinked so as to be adhered to the substrate.

Therefore, the film thickness t3 of the first refractive index layer 42 is determined in consideration of the improvement of the sensitivity characteristic and the shading characteristic in the above-described active pixel region while maintaining the adhesion of the anti-flare layer 44 in the optical black region 25.

Figure 7:
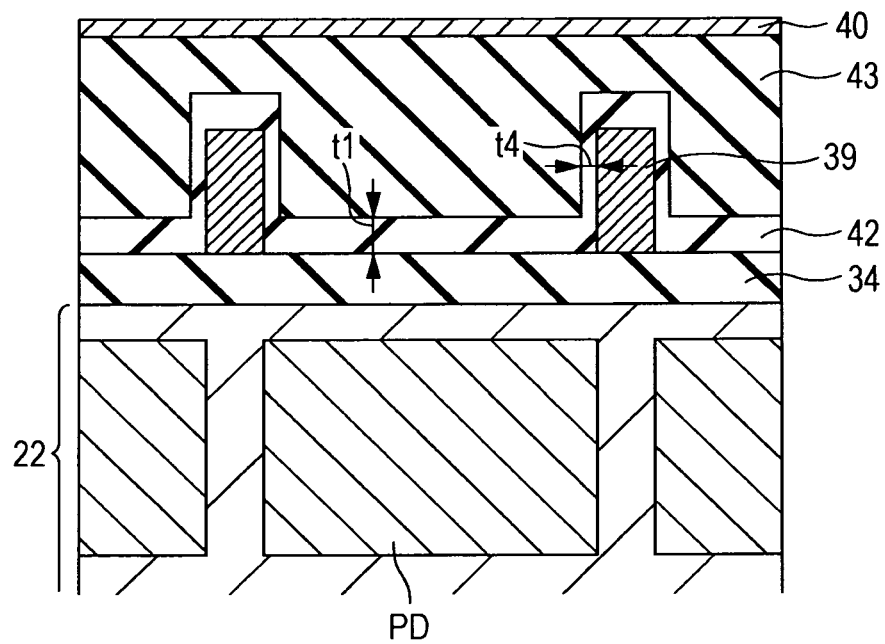
FIG. 7 is a diagram illustrating a film thickness of a first refractive index layer according to an embodiment of the present disclosure.
Figure 26:
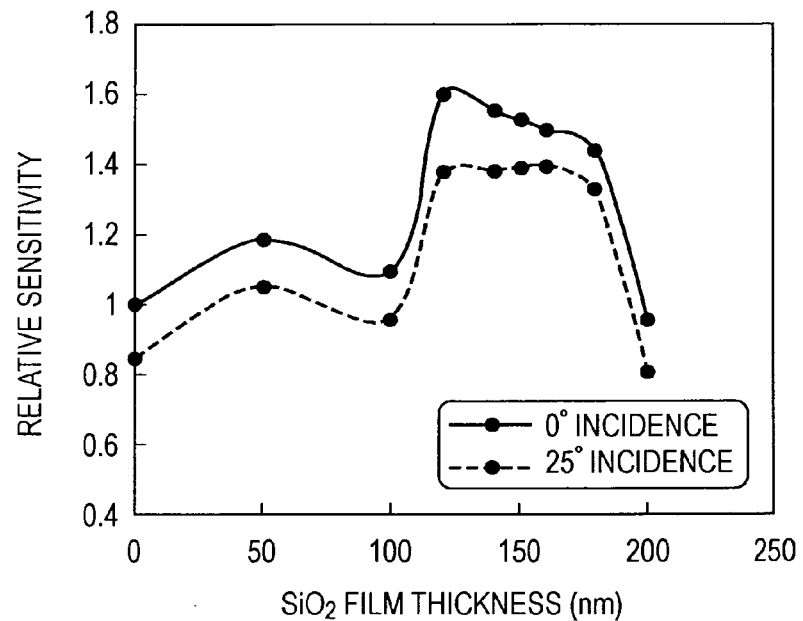
FIG. 26 is a diagram illustrating a sensitivity characteristic to a SiO film thickness as a graph in Table 1.

Table 1 shows the sensitivity characteristic in the film thickness of the first refractive index layer 42. Table 1 shows a sensitivity characteristic with respect to an incident angle of light when a silicon oxide (SiO) film is used as the first refractive index layer 42 in the active pixel region, and the SiO film thickness t4 of the side wall side of the light blocking layer 39 is varied (refer to FIG. 7). A sample having no first refractive index layer 42 is used as a comparative example. In addition, the silicon oxide (SiO) film is formed by a CVD method, and thus the film thickness t1 of the silicon oxide (SiO) film in the bottom of the concave portion corresponding to the photodiode PD in FIG. 7 is about 1.5 times the film thickness t4 of the SiO film thickness of the light blocking layer side wall. FIG. 26 shows the sensitivity characteristic with respect to the SiO film thickness as a graph of Table 1. Table 1 and FIG. 26 show a relative sensitivity characteristic when sensitivity is 1.0 at the incident light angle of 0° and the film thickness of 0 nm.

TABLE 1

| Angle of incident light | SiO FILM THICKNESS OF LIGHT BLOCKING LAYER SIDE WALL BETWEEN PIXELS | | | | | | | | |
|---|---|---|---|---|---|---|---|---|---|
| | 0 nm | 50 nm | 100 nm | 120 nm | 140 nm | 150 nm | 160 nm | 180 nm | 200 nm |
| 0° | 1.00 | 1.19 | 1.10 | 1.60 | 1.55 | 1.53 | 1.50 | 1.44 | 0.96 |
| 25° | 0.85 | 1.05 | 0.96 | 1.38 | 1.38 | 1.39 | 1.39 | 1.33 | 0.81 |

Table 2 shows the shading characteristic in the film thickness of the first refractive index layer 42. Table 2 shows respective sensitivity characteristics at the incident angle of 25° corresponding to an incident angle around the pixel region when the sensitivity characteristic "1.00" at the incident angle of 0° of incident light is used as a reference, and the film thickness t4 of the SiO film thickness of the side wall side of the light blocking layer 39. A sample having no first refractive index layer 42 is used as a comparative example.

TABLE 2

SiO FILM THICKNESS OF LIGHT BLOCKING LAYER SIDE WALL BETWEEN PIXELS

| Angle of incident light | 0 nm | 50 nm | 100 nm | 120 nm | 140 nm | 150 nm | 160 nm | 180 nm | 200 nm |
|---|---|---|---|---|---|---|---|---|---|
| 0° | 1.00 | 1.00 | 1.00 | 1.00 | 1.00 | 1.00 | 1.00 | 1.00 | 1.00 |
| 25° | 0.85 | 0.89 | 0.87 | 0.87 | 0.89 | 0.91 | 0.92 | 0.93 | 0.85 |

It can be seen from Table 1 and FIG. 26 that if the film thickness t4 of the first refractive index layer (SiO film) 42 in the active pixel region 24 is larger than 0 nm, and, preferably 50 nm or more to 200 nm below, the sensitivity characteristic is improved as compared with the comparative example. In addition, it can be seen from Table 2 that if the film thickness t4 of the first refractive index layer (SiO film) 42 in the active pixel region 24 is 50 nm or more to 200 nm below, the sensitivity characteristic at the incident angle of 25° is improved as compared with the comparative example. That is to say, a reduction amount in the sensitivity is smaller than in the related art. Therefore, it can be seen that the shading characteristic is improved.

In order to improve the shading characteristic or the color mixing characteristic, as described above, the color filter or the micro lens is shifted according to movement to the edges of the pixel region. If the shift amount is too large, incident light is blocked by the light blocking layer 39, and thus the sensitivity is deteriorated. As shown in Table 2, if the reduction in the sensitivity with respect to the incident angle is small, the small shift amount is also allowable, which thus leads to a structure where incident light is difficult to block with the light blocking layer 39.

A common film thickness of the first refractive index layer 42 in the active pixel region 24 and the optical black region 25 is set in consideration of adhesion of the anti-flare layer 44 in the optical black region 25. For example, in a case of the first refractive index layer 42 made of the silicon oxide (SiO) film, the film thickness t3 is set in a range of an SiO film thickness (in terms of the film thickness t1) which is preferable in the active pixel region 24 except for λ/2n. In order to further improve the sensitivity characteristic by shortening the distance between the micro lens 37 and the photodiode PD, the film thickness of the first refractive index layer 42 is preferably 100 nm or less. Therefore, in the first refractive index layer 42 of the silicon oxide (SiO) film, the film thickness t1=t3 is preferably 75 nm to 82 nm.

2. Second Embodiment

Configuration Example of Solid-State Imaging Device

Figure 8:
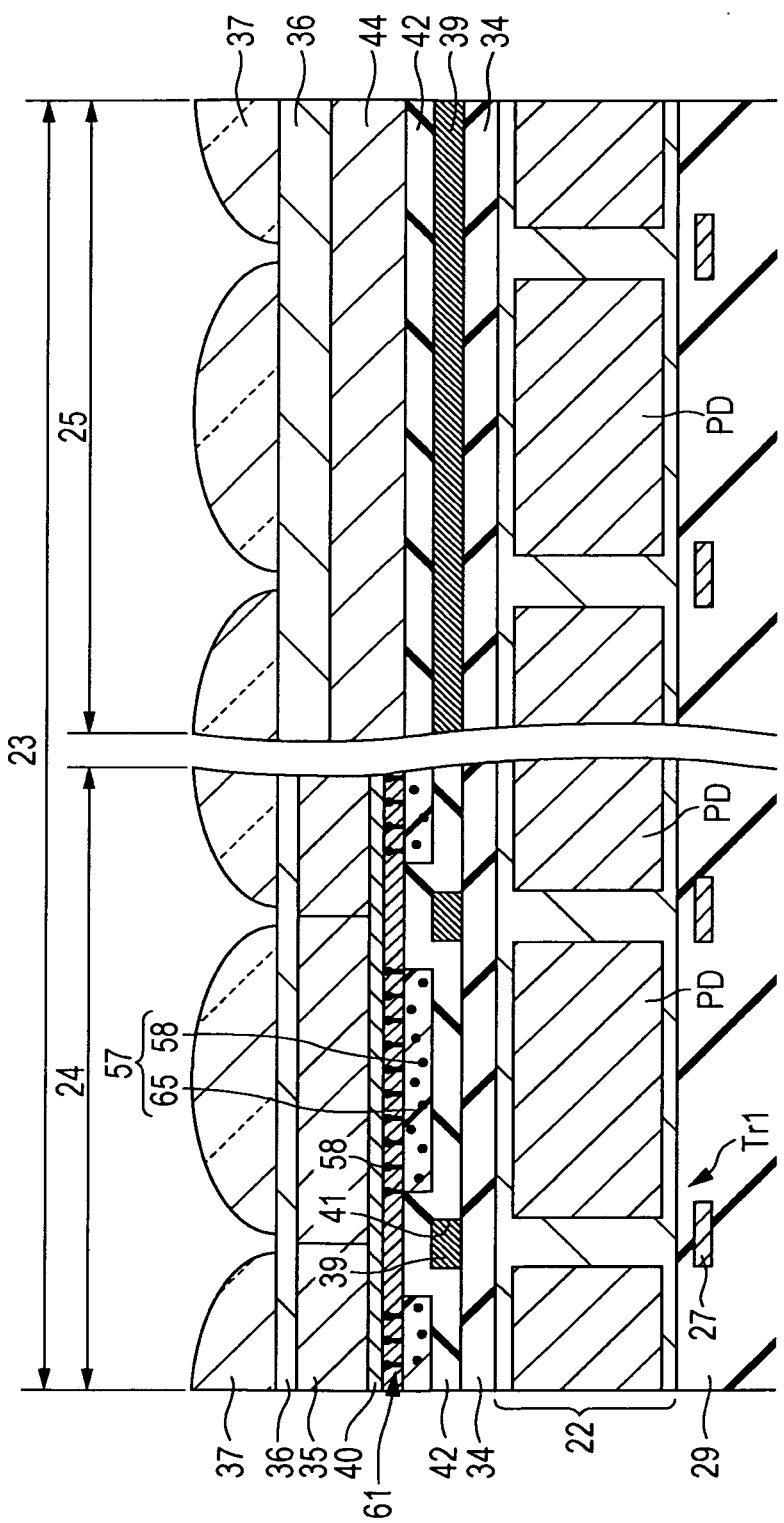
FIG. 8 is a schematic configuration diagram of main parts of a solid-state imaging device according to a second embodiment of the present disclosure.

FIG. 8 shows a solid-state imaging device according to a second embodiment of the present disclosure. The solid-state imaging device according to the embodiment employs a rear surface irradiation type CMOS solid-state imaging device. The solid-state imaging device 56 according to the second embodiment has a thinned semiconductor substrate 22 provided with a pixel region 23 where a plurality of pixels including photodiodes PD and a plurality of pixel transistors are arranged in a two-dimensional manner. Although not shown, a multi-layer wire layer is formed on the front surface side of the semiconductor substrate 22, and a supporting substrate is joined to the multi-layer wire layer, as shown in FIG. 1 described above. An insulating film 34 is formed on the rear surface of the semiconductor substrate 22.

In addition, in the embodiment, a light blocking layer 39 is formed on the insulating film 34 in the active pixel region 24 and the optical black region 25 of the pixel region 23. The light blocking layer 39 is formed so as to surround the photodiodes PD of the respective pixels in the active pixel region 24, and the light blocking layer 39 which is the same film extending from the light blocking layer 39 in the active pixel region 24 is formed on the entire surface in the optical black region 25. In the active pixel region 24, a concave portion 41 surrounded by the light blocking layer 39 is formed in a region corresponding to each photodiode PD.

A first refractive index layer 42 having a relatively low refractive index is formed on the surfaces of the light blocking layer 39 and the concave portions 41 from the active pixel region 24 to the optical black region 25. In the active pixel region 24, a second refractive index layer 57 which has a relatively high refractive index is formed on the first refractive index layer 42 so as to be buried in the concave portion 41. The second refractive index layer 57 is formed using a thermosetting resin 59 containing metal particulates 58. The thermosetting resin 59 which is a base uses a simple acrylic resin, a novolac resin, a styrene resin, a copolymer resin thereof, a polyimide resin, a silloxane resin, or the like. The metal particulates 58 use zinc oxide, zirconium oxide, titanium oxide, tin oxide, or the like. It is possible to heighten a refractive index of the resin 59 by containing the metal particulates 58 in the resin 59.

Since the second refractive index layer 57 is an organic film formed by containing the metal particulates 58, a tiny convex structure 61 of the metal particulates 58 is formed on the surface of the second refractive index layer 57 through a dry etching process for planarization after being applied and formed. The tiny convex structure 61 has a kind of moth-eye structure, and functions as an anti-reflection film. The light blocking layer 39, the first refractive index layer 42, the second refractive index layer 57, and the tiny convex structure 61 which is an anti-reflection film form an internal light collecting body so as to correspond to the photodiode PD of each pixel.

In addition, color filters 35 are formed on the surface of the tiny convex structure 61 via a planarization film 40, and micro lenses 37 are formed thereon via a planarization film 36.

In the optical black region 25, in the same manner as the first embodiment, an anti-flare layer 44 is formed on the first refractive index layer 42, and the micro lenses 37 are formed thereon via the planarization film 36.

Other configurations are the same as those described in the first embodiment, and repeated description will be omitted. In FIG. 8, parts corresponding to those in FIG. 1 are shown by giving the same reference numerals thereto.

Manufacturing Method Example of Solid-State Imaging Device

Figure 9A:
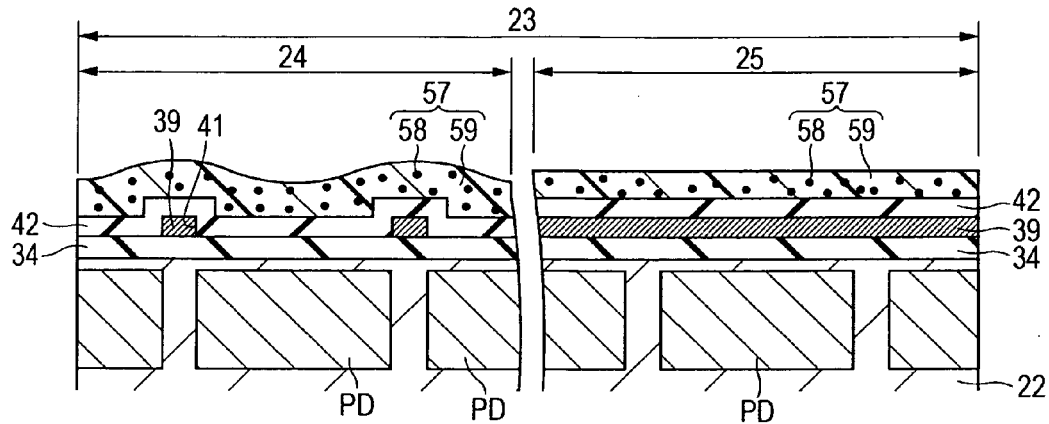
FIGS. 9A to 9C are manufacturing process diagrams of the main parts illustrating a manufacturing method example of the solid-state imaging device according to the second embodiment.
Figure 9B:
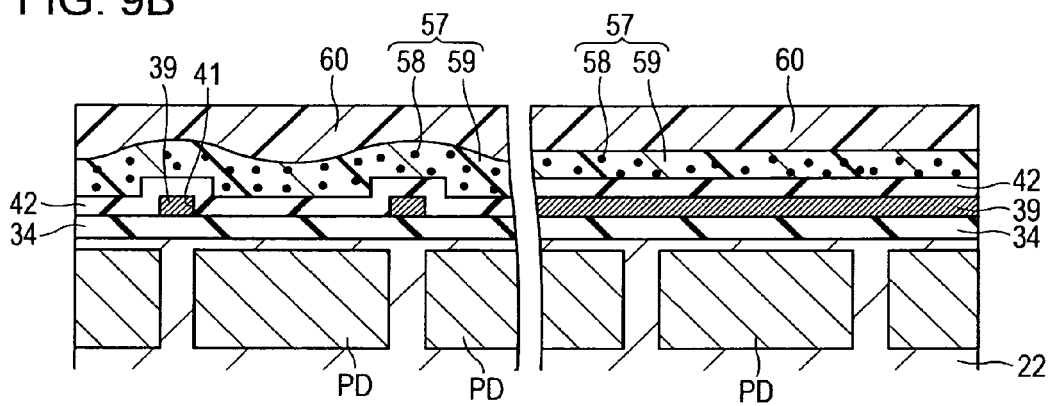
Figure 9C:
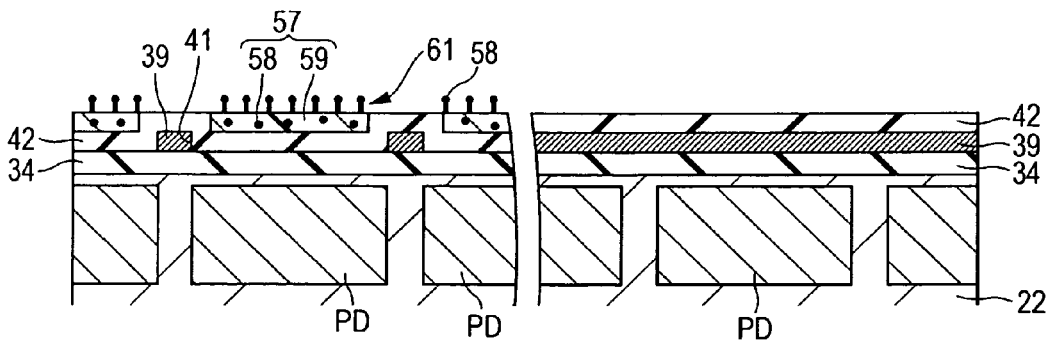

FIGS. 9A to 9C show a manufacturing method example of the solid-state imaging device 56 according to the second embodiment. The figures show only formation of the internal light collecting body of the active pixel region 24, and manufacturing processes of the other configurations including the optical black region are the same as those in the first embodiment, and thus description thereof will be omitted.

As shown in FIG. 9A, a planarization film 34 is formed on the rear surface of the semiconductor substrate 22 provided with the photodiodes PD so as to form the light blocking layer 39 which blocks light from entering between the pixels on the planarization film 34. As described above, the light blocking layer 39 is formed so as to surround each of the photodiodes PD and to form the concave portion 41 in the region corresponding to each of the photodiodes PD. Next, the first refractive index layer 42 having a relatively low refractive index is formed on the entire surfaces of the light blocking layer 39 and the concave portions 41.

Next, the second refractive index layer 57 having a relatively high refractive index is formed on the first refractive index layer 42 so as to be buried in the concave portion 41. The second refractive index layer 57 is formed through spin coating of the thermosetting resin 59 containing the metal particulates 58. As described above, the thermosetting resin 59 may use a simple resin such as an acrylic resin, a novolac resin, or a styrene resin, a copolymer resin thereof, a polyimide resin, or the like. As described above, the metal particulates 58 use zinc oxide, zirconium oxide, titanium oxide, tin oxide, or the like, and are appropriately added to the resin 59. The second refractive index layer 57 is formed in a concave-convex state with respect to the unit pixel in relation to a state after being formed using the thermosetting resin 59.

Next, as shown in FIG. 9B, a thermosetting resin layer 60 having the same composition as the thermosetting resin 59 used for the second refractive index layer 57 is spin-coated on the second refractive index layer 57 such that the surface thereof is substantially planarized. This is because the composition of the materials of the overlying thermosetting resin 60 and the resin 59 of the second refractive index layer 57 match each other such that an etching rate is made to correspond to each other for planarization of the second refractive index layer 57, and thereby a planarization process in the subsequent dry etching is performed more favorably.

Next, as shown in FIG. 9C, the uppermost thermosetting resin 60 is entirely etched back from the upper surface thereof using, for example, a reactive ion etching (RIE) method or the like. The unevenness of the surface of the second refractive index layer 57 is reduced or the surface of the second refractive index layer 57 is planarized by etching back the entire surfaces.

In addition, the second refractive index layer 57 is an organic film to which the metal particulates 58 are added. For this reason, in the dry etching, the metal particulates 58 are used as an etching mask, and, thus, as shown in FIG. 9C, the surface of the thermosetting resin 59 which is an organic film is removed and only the metal particulates 58 are left, thereby forming the tiny convex structure 61. The structure 61, as described above, has a moth-eye structure, and functions as an anti-reflection film. The light blocking layer 39, the first refractive index layer 42, the second refractive index layer 57, and the structure 61 which is an anti-reflection film form an internal light collecting body.

Manufacturing processes of other configurations are the same as those described in the first embodiment. In this way, the desired solid-state imaging device 56 is obtained.

In the solid-state imaging device 56 according to the second embodiment, as described in the first embodiment, incident light passing through the micro lenses 37 is collected by the substantial light collecting body formed by the light blocking layer 39, the first refractive index layer 42, and the second refractive index layer 57 is incident to the photodiode PD. Since the structure 61 of the metal particulates 58 functioning as an anti-reflection film is formed on the surface of the second refractive index layer 57, reflection at the interface between the second refractive index layer 57 and the overlying layer is suppressed, and thus it is possible to further improve light use efficiency and light collecting efficiency in the internal light collecting body. Therefore, the sensitivity characteristic in the solid-state imaging device 56 is improved, and the shading characteristic indicating a sensitivity difference between the center and the periphery in the active pixel region 24 can be improved.

In the optical black region 25, since the anti-flare layer 44 is formed on the light blocking layer 39 using a photosensitive film via the first refractive index layer 42, adhesion of the anti-flare layer 44 is improved, and thus it is possible to form the anti-flare layer 44 having high reliability. Therefore, it is possible to provide a rear surface irradiation type CMOS solid-state imaging device with high image quality. In addition, the same effects described in the first embodiment are achieved.

3. Third Embodiment

Configuration Example of Solid-State Imaging Device

Figure 10:
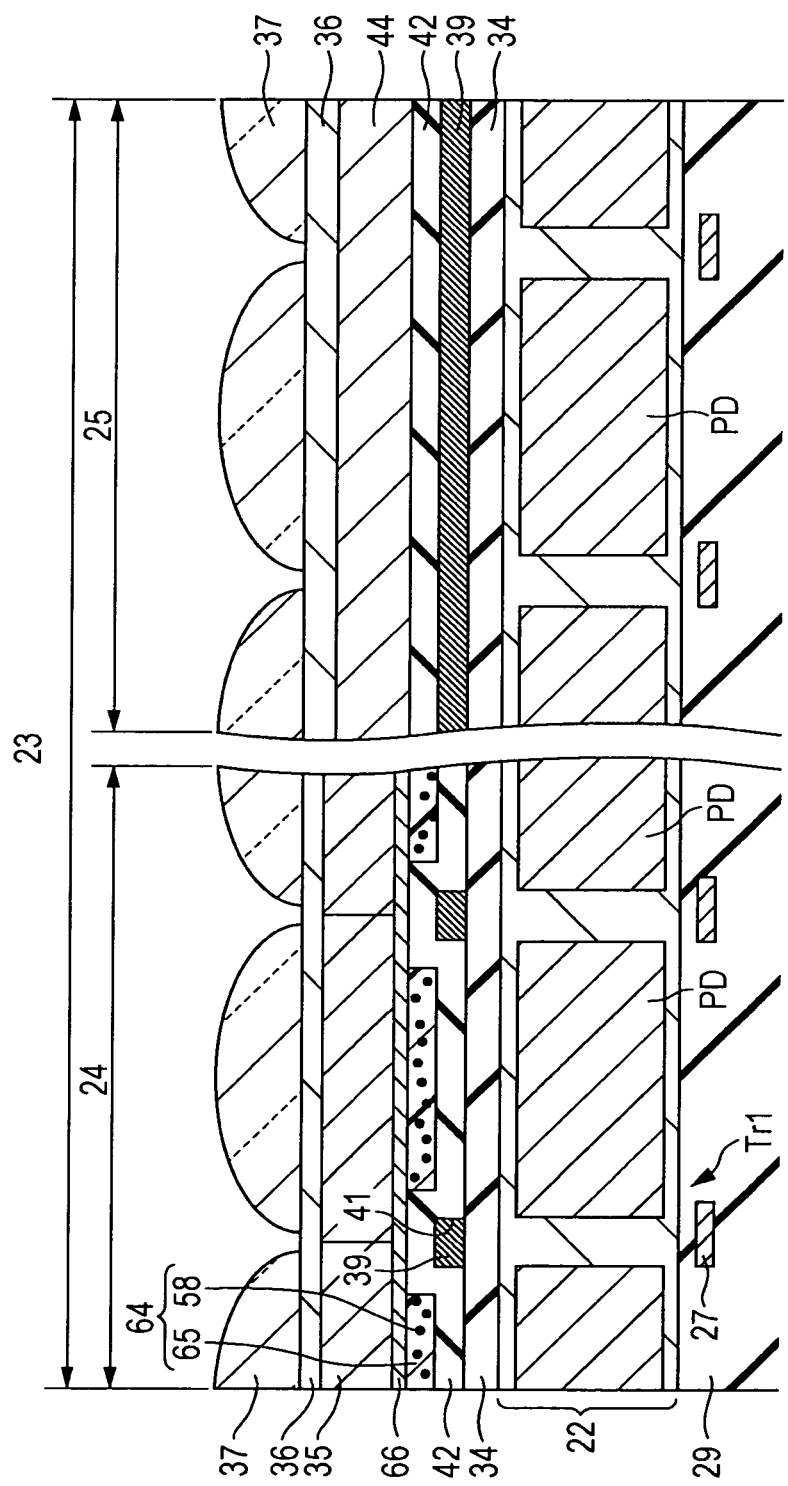
FIG. 10 is a schematic configuration diagram of main parts of a solid-state imaging device according to a third embodiment of the present disclosure.

FIG. 10 shows a solid-state imaging device according to a third embodiment of the present disclosure. The solid-state imaging device according to the embodiment employs a rear surface irradiation type CMOS solid-state imaging device. The solid-state imaging device 63 according to the third embodiment has a thinned semiconductor substrate 22 provided with a pixel region 23 where a plurality of pixels including photodiodes PD and a plurality of pixel transistors are arranged in a two-dimensional manner. Although not shown, a multi-layer wire layer is formed on the front surface side of the semiconductor substrate 22, and a supporting substrate is joined to the multi-layer wire layer, as shown in FIG. 1 described above. An insulating film 34 is formed on the rear surface of the semiconductor substrate 22.

In addition, in the embodiment, a light blocking layer 39 is formed on the insulating film 34 in the active pixel region 24 and the optical black region 25 of the pixel region 23. The light blocking layer 39 is formed so as to surround the photodiodes PD of the respective pixels in the active pixel region 24, and the light blocking layer 39 which is the same film extending from the light blocking layer 39 in the active pixel region 24 is formed on the entire surface in the optical black region 25. In the active pixel region 24, a concave portion 41 surrounded by the light blocking layer 39 is formed at a region corresponding to each photodiode PD.

A first refractive index layer 42 having a relatively low refractive index is formed on the surfaces of the light blocking layer 39 and the concave portions 41 from the active pixel region 24 to the optical black region 25. In the active pixel region 24, a second refractive index layer 64 which has a relatively high refractive index is formed on the first refractive index layer 42 so as to be buried in the concave portion 41. The second refractive index layer 64 is formed using a thermosetting resin 65 having heat flow kinesis at a temperature which is equal to or less than a temperature at which a resin containing metal particulates 58 is cured. The thermosetting resin 65 which is a base and has the heat flow kinesis uses an acrylic resin, a silloxane resin, or the like. The metal particulates 58 use zinc oxide, zirconium oxide, titanium oxide, tin oxide, or the like. It is possible to heighten a refractive index of the resin 65 by containing the metal particulates 58 in the resin 65. A planarization film 66 having a refractive index lower than the second refractive index layer 64 is formed on the second refractive index layer 64 of which the surface is planarized.

The light blocking layer 39, the first refractive index layer 42, and the second refractive index layer 64 form an internal light collecting body so as to correspond to the photodiode PD of each pixel. In addition, color filters 35 are formed on the planarization film 66, and micro lenses 37 are formed thereon via a planarization film 36. In the optical black region 25, in the same manner as the first embodiment, an anti-flare layer 44 is formed on the first refractive index layer 42, and the micro lenses 37 are formed thereon via the planarization film 36.

Other configurations are the same as those described in the first embodiment, and repeated description will be omitted. In FIG. 10, parts corresponding to FIG. 1 are shown by giving the same reference numerals thereto.

Manufacturing Method Example of Solid-State Imaging Device

Figure 11A:
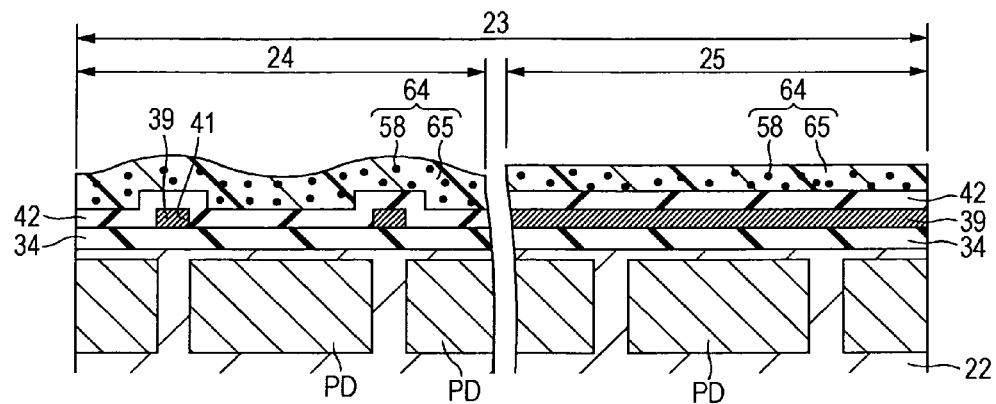
FIGS. 11A to 11C are manufacturing process diagrams of the main parts illustrating a manufacturing method example of the solid-state imaging device according to the third embodiment.
Figure 11B:
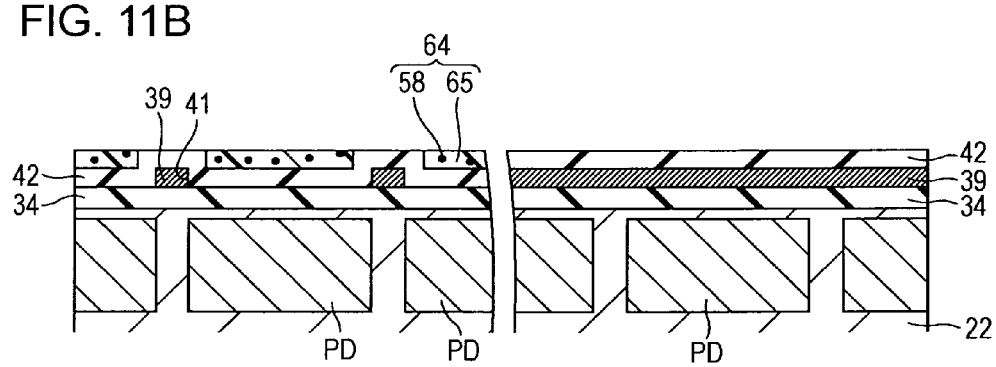
Figure 11C:
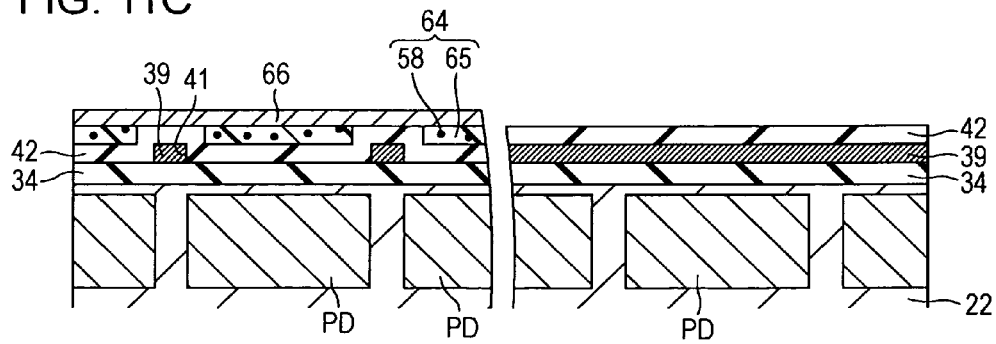

FIGS. 11A to 11C show a manufacturing method example of the solid-state imaging device 63 according to the third embodiment. The figures show only formation of the internal light collecting body of the active pixel region 24, and manufacturing processes of the other configurations including the optical black region are the same as those in the first embodiment, and thus description thereof will be omitted.

As shown in FIG. 11A, a planarization film 34 is formed on the rear surface of the semiconductor substrate 22 provided with the photodiodes PD so as to form the light blocking layer 39 which blocks light from entering between the pixels on the planarization film 34. As described above, the light blocking layer 39 is formed so as to surround each of the photodiodes PD and to form the concave portion 41 in the region corresponding to each of the photodiodes PD. Next, the first refractive index layer 42 having a relatively low refractive index is formed on the entire surfaces of the light blocking layer 39 and the concave portions 41.

Next, the second refractive index layer 64 having a relatively high refractive index is formed on the first refractive index layer 42 so as to be buried in the concave portion 41. The second refractive index layer 64 is formed through spin coating of the thermosetting resin 65 having heat flow kinesis at a temperature which is less than a temperature at which a resin containing the metal particulates 58 is cured. A feature is to use a material having a planarization function since the resin has the heat flow kinesis under the heating condition of a temperature less than the temperature at which the resin is cured, and the material is thermally cured at the temperature where the resin is cured. As described above, the thermosetting resin 65 may use a simple resin such as an acrylic resin, a novolac resin, or a styrene resin, a copolymer resin thereof, a silloxane resin, or the like. As described above, the metal particulates 58 use zinc oxide, zirconium oxide, titanium oxide, tin oxide, or the like, and are appropriately added to the resin 65. The second refractive index layer 64 is formed so as to be rolled in a concave-convex shape with respect to the unit pixel in relation to a state after being formed using the thermosetting resin 65.

Next, as shown in FIG. 11B, a heat treatment is performed for the second refractive index layer 64 of which the surface is rolled in a concave-convex shape such that the second refractive index layer 64 is made to flow by heat, whereby the surface of the second refractive index layer 64 is substantially planarized, and a cured film of the second refractive index layer 64 is formed. Thereafter, the active pixel region 24 is masked, and the second refractive index layer 64 in the optical black region 25 is removed. In the planarization process of the second refractive index layer 64 in the embodiment, the resin layer is formed on the upper layer, and thus a process by etch-back (dry etching) or a CMP (Chemical Mechanical Polishing) method may not be performed.

Next, as shown in FIG. 11C, the planarization film 66 having a refractive index lower than the second refractive index layer 64 is formed. In this way, the light blocking layer 39, the first refractive index layer 42, and the second refractive index layer 64 form an internal light collecting body.

Manufacturing processes of other configurations are the same as those described in the first embodiment. In this way, the desired solid-state imaging device 63 is obtained.

In the solid-state imaging device 63 according to the third embodiment, as described in the first embodiment, incident light passing through the micro lenses 37 is collected by the internal light collecting body formed by the light blocking layer 39, the first refractive index layer 42, and the second refractive index layer 64 is incident to the photodiode PD. Since the structure 61 of the metal particulates 58 functioning as an anti-reflection film is formed on the surface of the second refractive index layer 64, reflection at the interface between the second refractive index layer 64 and the overlying layer is suppressed, and thus it is possible to further improve light use efficiency and light collecting efficiency in the internal light collecting body. Therefore, the sensitivity characteristic in the solid-state imaging device 63 is improved, and the shading characteristic indicating a sensitivity difference between the center and the periphery in the active pixel region 24 can be improved.

In the optical black region 25, since the anti-flare layer 44 is formed on the light blocking layer 39 using a photosensitive film via the first refractive index layer 42, adhesion of the anti-flare layer 44 is improved, and thus it is possible to form the anti-flare layer 44 having high reliability. Therefore, it is possible to provide a rear surface irradiation type CMOS solid-state imaging device with high image quality. In addition, the same effects described in the first embodiment are achieved.

4. Fourth Embodiment

Configuration Example of Solid-State Imaging Device

Figure 12:
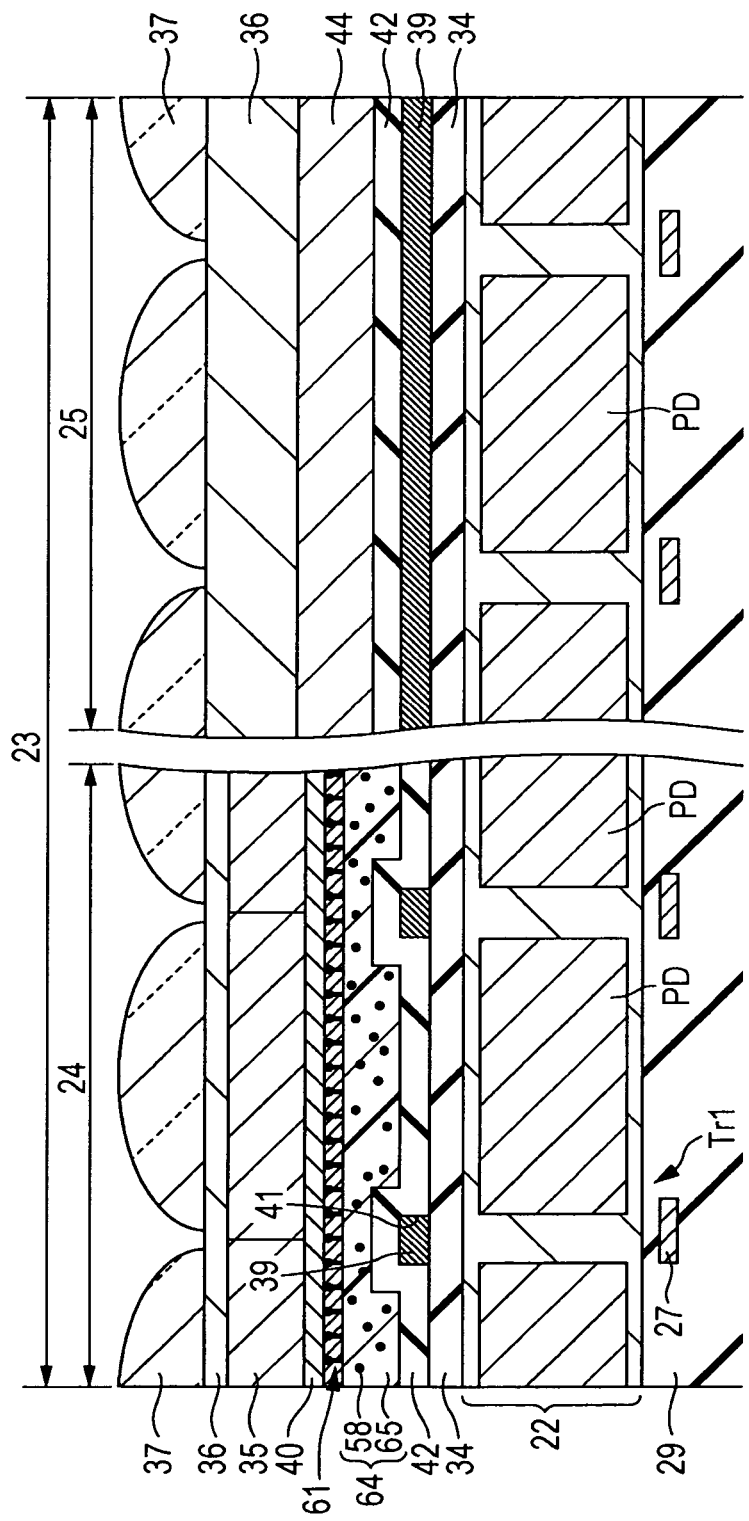
FIG. 12 is a schematic configuration diagram of main parts of a solid-state imaging device according to a fourth embodiment of the present disclosure.

FIG. 12 shows a solid-state imaging device according to a fourth embodiment of the present disclosure. The solid-state imaging device according to the embodiment employs a rear surface irradiation type CMOS solid-state imaging device. The solid-state imaging device 67 according to the fourth embodiment corresponds to a modified example of the third embodiment.

In the solid-state imaging device 67 according to the fourth embodiment, the second refractive index layer 64 having a relatively high refractive index is formed on the first refractive index layer 42 having a relatively low refractive index using a thermosetting resin 65 containing the metal particulates 58 in the active pixel region 24. The thermosetting resin 65 in this case is a resin having thermoplasticity (heat flow kinesis) at a temperature which is equal to or lower than a temperature where the resin is cured. In addition, a tiny convex structure 61 of the metal particulates 58 is formed on the surface of the second refractive index layer 64. The tiny convex structure 61 has a kind of moth-eye structure, and functions as an anti-reflection film. The light blocking layer 39, the first refractive index layer 42, the second refractive index layer 64, and the tiny convex structure 61 which is an anti-reflection film form an internal light collecting body so as to correspond to the photodiode PD of each pixel.

Other configurations are the same as those described in the third embodiment. In FIG. 12, parts corresponding to those in FIG. 10 are shown by giving the same reference numerals thereto, and repeated description will be omitted.

Manufacturing Method Example of Solid-State Imaging Device

In the manufacturing method of the solid-state imaging device 67 according to the fourth embodiment, after the process shown in FIG. 11A, a thermosetting resin layer having the same composition as the thermosetting resin 65 having thermoplasticity (heat flow kinesis) is formed on the second refractive index layer 64 at a temperature which is equal to or lower than a temperature where the resin of the second refractive index layer 64 is cured. In addition, the thermosetting resin is etched back from the upper surface thereof, thereby planarizing the surface of the second refractive index layer 64 and forming the tiny convex structure 61 of the metal particulates 58 of the surface. These processes are similar to the processes shown in FIGS. 9A to 9C. Other configurations and processes are the same as those described in the third embodiment.

In the solid-state imaging device 67 according to the fourth embodiment, incident light passing through the micro lenses 37 is collected by the substantial light collecting body formed by the light blocking layer 39, the first refractive index layer 42, and the second refractive index layer 64 is incident to the photodiode PD. Since the structure 61 of the metal particulates 58 functioning as an anti-reflection film is formed on the surface of the second refractive index layer 64, reflection at the interface between the second refractive index layer 64 and the overlying layer is suppressed, and thus it is possible to further improve light use efficiency and light collecting efficiency in the internal light collecting body. Therefore, the sensitivity characteristic in the solid-state imaging device 67 is improved, and the shading characteristic indicating a sensitivity difference between the center and the periphery in the active pixel region 24 can be improved.

In the optical black region 25, since the anti-flare layer 44 is formed on the light blocking layer 39 using a photosensitive film via the first refractive index layer 42, adhesion of the anti-flare layer 44 is improved, and thus it is possible to form the anti-flare layer 44 having high reliability. Therefore, it is possible to provide a rear surface irradiation type CMOS solid-state imaging device with high image quality. In addition, the same effects described in the first embodiment are achieved.

5. Fifth Embodiment

Figure 13:
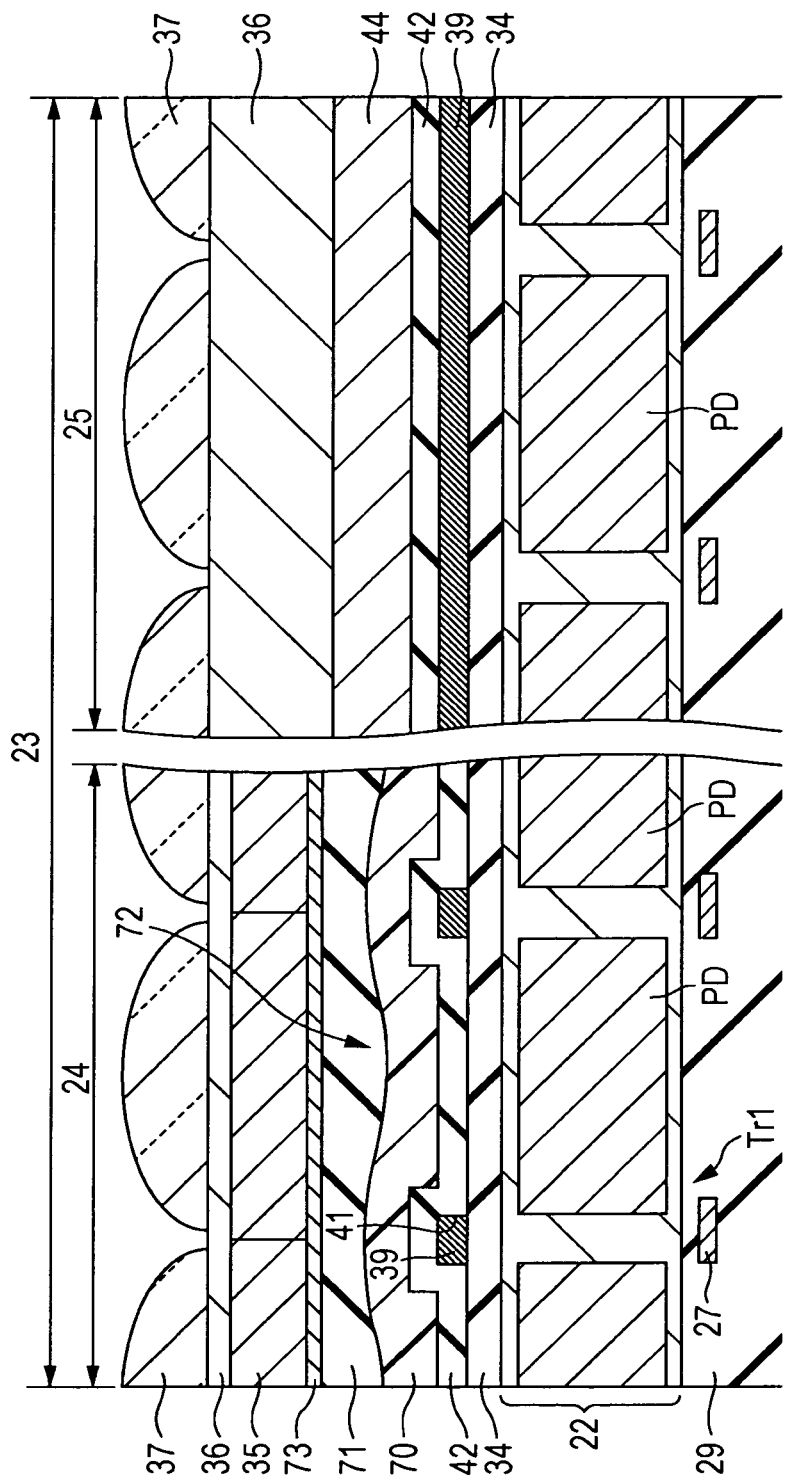
FIG. 13 is a schematic configuration diagram of main parts of a solid-state imaging device according to a fifth embodiment of the present disclosure.

FIG. 13 shows a solid-state imaging device according to a fifth embodiment of the present disclosure. The solid-state imaging device according to the embodiment employs a rear surface irradiation type CMOS solid-state imaging device. The solid-state imaging device 69 according to the fifth embodiment has a thinned semiconductor substrate 22 provided with a pixel region 23 where a plurality of pixels including photodiodes PD and a plurality of pixel transistors are arranged in a two-dimensional manner. Although not shown, a multi-layer wire layer is formed on the front surface side of the semiconductor substrate 22, and a supporting substrate is joined to the multi-layer wire layer, as shown in FIG. 1 described above. An insulating film 34 is formed on the rear surface of the semiconductor substrate 22.

In addition, in the embodiment, a light blocking layer 39 is formed on the insulating film 34 in the active pixel region 24 and the optical black region 25 of the pixel region 23. The light blocking layer 39 is formed so as to surround the photodiodes PD of the respective pixels in the active pixel region 24, and the light blocking layer 39 which is the same film extending from the light blocking layer 39 in the active pixel region 24 is formed on the entire surface in the optical black region 25. In the active pixel region 24, a concave portion 41 surrounded by the light blocking layer 39 is formed in a region corresponding to each photodiode PD.

A first refractive index layer 42 having a relatively low refractive index is formed on the surfaces of the light blocking layer 39 and the concave portions 41 from the active pixel region 24 to the optical black region 25. In the active pixel region 24, a second refractive index layer 70 which has a relatively high refractive index is formed on the first refractive index layer 42 so as to be buried in the concave portion 41. The refractive index of the first refractive index layer 42 is lower than the refractive index of the second refractive index layer 70. The surface of the second refractive index layer 70 is formed in a concave-convex shape such that the part corresponding to the photodiode PD is convex downwardly.

In addition, a third refractive index layer 71 having a refractive index higher than the second refractive index layer 70 is formed on the second refractive index layer 70. The surface of the third refractive index layer 71 is planarized. The magnitude correlation of the refractive index is the first refractive index layer 42<the second refractive index layer 70<the third refractive index layer 71. The second refractive index layer 70 and the third refractive index layer 71 form an intra-layer lens 72 at the upper side of the photodiode PD. In addition, the light blocking layer 39, the first refractive index layer 42, and the second refractive index layer 70 form an internal light collecting body.

In addition, color filters 35 are formed on the third refractive index layer 71 via the planarization film 40, and micro lenses 37 are formed thereon via a planarization film 36.

In the optical black region 25, in the same manner as the first embodiment, an anti-flare layer 44 is formed on the first refractive index layer 42, and the micro lenses 37 are formed thereon via the planarization film 36.

Other configurations are the same as those described in the first embodiment. In FIG. 13, parts corresponding to those in FIG. 1 are shown by giving the same reference numerals thereto, and repeated description will be omitted.

Manufacturing Method Example of Solid-State Imaging Device

Figure 14A:
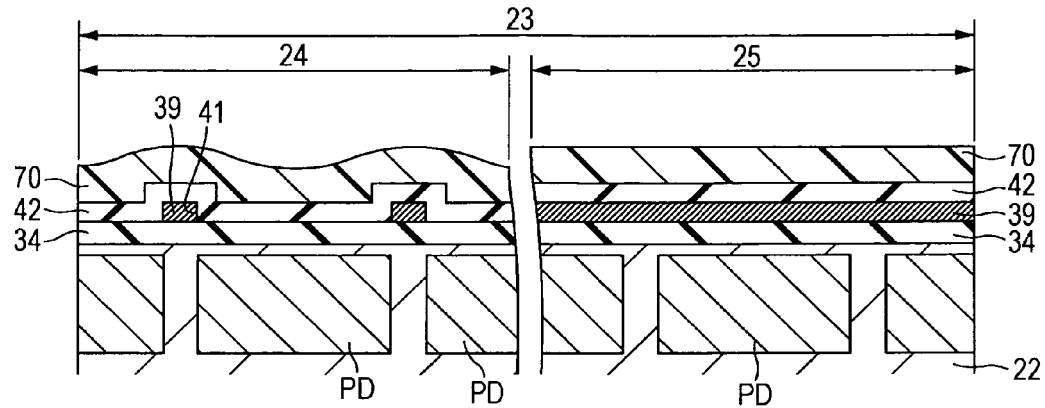
FIGS. 14A to 14C are manufacturing process diagrams of the main parts illustrating a manufacturing method example of the solid-state imaging device according to the fifth embodiment.
Figure 14B:
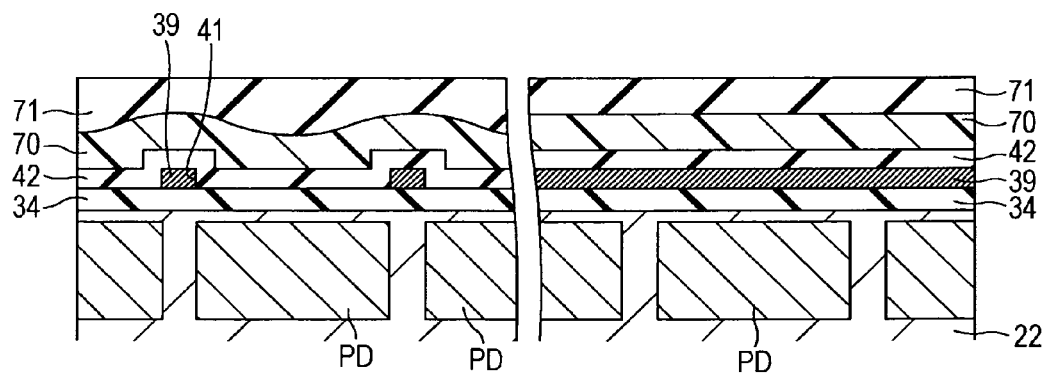
Figure 14C:
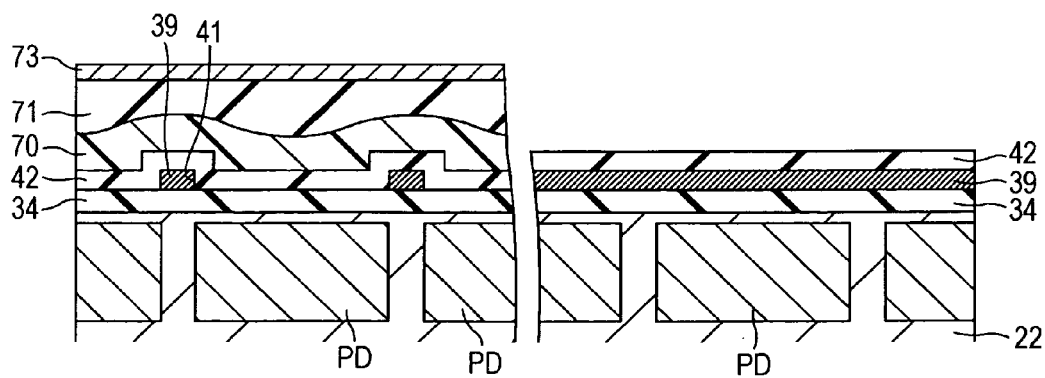

FIGS. 14A to 14C show a manufacturing method example of the solid-state imaging device 69 according to the fifth embodiment. The figures show only formation of the intra-layer lens and the internal light collecting body of the active pixel region 24, and manufacturing processes of the other configurations including the optical black region are the same as those in the first embodiment, and thus description thereof will be omitted.

As shown in FIG. 14A, a planarization film 34 is formed on the rear surface of the semiconductor substrate 22 provided with the photodiodes PD so as to form the light blocking layer 39 which blocks light from entering between the pixels on the planarization film 34. As described above, the light blocking layer 39 is formed so as to surround each of the photodiodes PD and to form the concave portion 41 in the region corresponding to each of the photodiodes PD. Next, the first refractive index layer 42 having a relatively low refractive index is formed on the entire surfaces of the light blocking layer 39 and the concave portions 41. As described above, the first refractive index layer 42 may use, for example, a silicon oxide film, a silicon carbide oxide film, a magnesium fluoride film, a calcium fluoride film, or the like.

Next, the second refractive index layer 70 having a refractive index higher than the first refractive index layer 42 is formed on the first refractive index layer 42 so as to be buried in the concave portion 41. The second refractive index layer 70 may be formed using a thermosetting resin. The thermosetting resin uses an acrylic resin. Since the thermosetting resin is cured by heat in a form of substantially maintaining a coated state unlike the thermoplastic resin, the thermosetting resin is formed in a concave shape where the photodiode PD side is low and the light blocking layer 39 side between the pixels is high in relation to a cross-sectional shape.

Next, as shown in FIG. 14B, the third refractive index layer 71 having a high refractive index higher than the second refractive index layer 70 is formed on the second refractive index layer 70. The upper surface of the third refractive index layer 71 is formed to be planarized. For example, an acrylic thermoplastic resin is used as a material of the third refractive index layer 71, and metal particulates are added to the resin. The metal particulates use zinc oxide, zirconium oxide, titanium oxide, tin oxide, or the like, and are appropriately added to the resin. In addition, the third refractive index layer 71 may be formed using a material obtained by adding metal particulates to a thermosetting resin in addition to the thermoplastic resin. Further, the third refractive index layer 71 may be formed using a thermosetting resin, a silicon nitride film, or a silicon oxide nitride film. In a case where the third refractive index layer 71 is formed using the thermosetting resin, the silicon nitride film, or the silicon oxide nitride film, etch-back or a CMP process is appropriately used to planarize the upper surface of the third refractive index layer 71 in the subsequent processes.

The light blocking layer 39, the first refractive index layer 42, and the second refractive index layer 70 form an internal light collecting body. In addition, the second refractive index layer 70 and the third refractive index layer 71 form the intra-layer lens 72.

Next, as shown in FIG. 14C, a planarization film 73 having a refractive index lower than the third refractive index layer 71 is formed on the third refractive index layer 71. Thereafter, the active pixel region 24 is masked. The planarization film 73, the third refractive index layer 71, and the second refractive index layer 70 are removed from the optical black region 25.

Manufacturing processes of other configurations are the same as those described in the first embodiment. In this way, the desired solid-state imaging device 69 is obtained.

In the solid-state imaging device 69 according to the fifth embodiment, incident light passing through the micro lenses 37 is collected by the intra-layer lens 72 and the internal light collecting body formed by the light blocking layer 39, the first refractive index layer 42, and the second refractive index layer 70 is incident to the photodiode PD. Therefore, the sensitivity characteristic in the solid-state imaging device 69 is improved, and the shading characteristic indicating a sensitivity difference between the center and the periphery in the active pixel region 24 can be improved.

In the optical black region 25, since the anti-flare layer 44 is formed on the light blocking layer 39 using a photosensitive film via the first refractive index layer 42, adhesion of the anti-flare layer 44 is improved, and thus it is possible to form the anti-flare layer 44 having high reliability. Therefore, it is possible to provide a rear surface irradiation type CMOS solid-state imaging device with high image quality. In addition, the same effects described in the first embodiment are achieved.

6. Sixth Embodiment

Configuration Example of Solid-State Imaging Device

Figure 15:
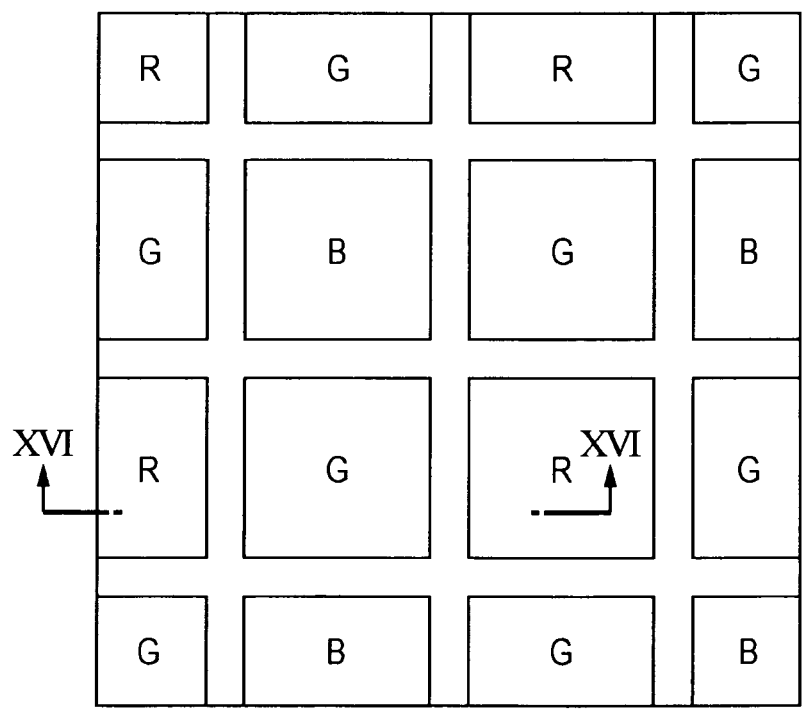
FIG. 15 is a plan view of primary color filters of a Bayer arrangement applied to a solid-state imaging device according to a sixth embodiment.
Figure 16:
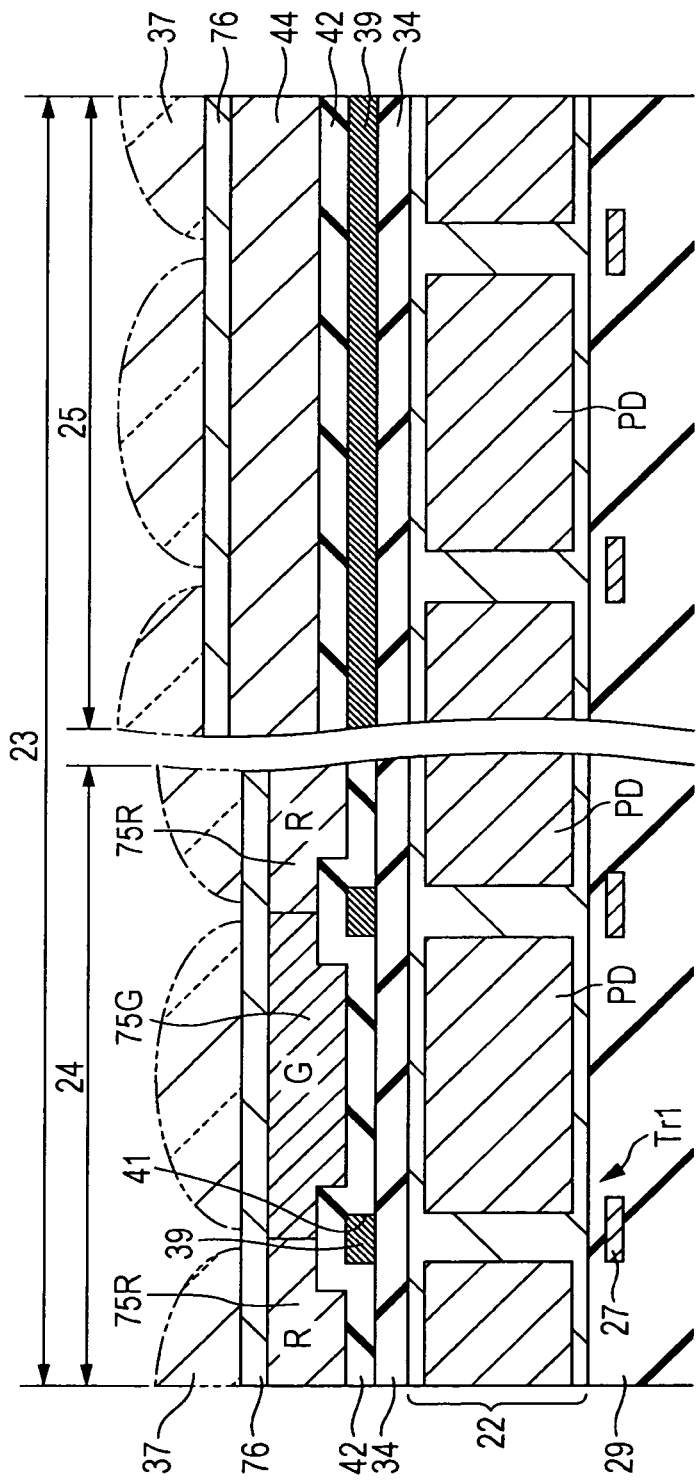
FIG. 16 is a schematic configuration diagram of main parts of a solid-state imaging device according to the sixth embodiment of the present disclosure.

FIGS. 15 and 16 show a solid-state imaging device according to a sixth embodiment of the present disclosure. The solid-state imaging device according to the embodiment employs a rear surface irradiation type CMOS solid-state imaging device. FIG. 15 is a plan view of a color filter 75 formed by a primary color system of green, red and blue according to the embodiment. The color filter 75 has a configuration in which green, red, and blue are in a Bayer arrangement. FIG. 16 is a cross-sectional view taken along the line XVI-XVI in FIG. 15 and shows a cross-sectional structure in the active pixel region 24.

As shown in FIG. 16, the solid-state imaging device 77 according to the sixth embodiment has a thinned semiconductor substrate 22 provided with a pixel region 23 where a plurality of pixels including photodiodes PD and a plurality of pixel transistors are arranged in a two-dimensional manner. Although not shown, a multi-layer wire layer is formed on the front surface side of the semiconductor substrate 22, and a supporting substrate is joined to the multi-layer wire layer, as shown in FIG. 1 described above. An insulating film 34 is formed on the rear surface of the semiconductor substrate 22.

In addition, in the embodiment, a light blocking layer 39 is formed on the insulating film 34 in the active pixel region 24 and the optical black region 25 of the pixel region 23. The light blocking layer 39 is formed so as to surround the photodiodes PD of the respective pixels in the active pixel region 24, and the light blocking layer 39 which is the same film extending from the light blocking layer 39 in the active pixel region 24 is formed on the entire surface in the optical black region 25. In the active pixel region 24, a concave portion 41 surrounded by the light blocking layer 39 is formed in a region corresponding to each photodiode PD.

A first refractive index layer 42 having a relatively low refractive index is formed on the surfaces of the light blocking layer 39 and the concave portions 41 from the active pixel region 24 to the optical black region 25. In the active pixel region 24, and the color filter 75 which is a second refractive index layer having a refractive index higher than the first refractive index layer 42 is formed on the first refractive index layer 42 so as to be buried in the concave portion 41. In this example, the planarized upper surface of the color filter 75 is located higher than the light blocking layer 39 and is formed. The light blocking layer 39, the first refractive index layer 42, and the color filter 75 which is the second refractive index layer, form an internal light collecting body. A planarization film 76 having a refractive index lower than the color filter 75 is formed on the color filter 75.

On the other hand, in the optical black region 25, an anti-flare layer 44 is formed on the first refractive index layer 42 using, for example, the color filter 75. The planarization film 76 is formed on the anti-flare layer 44 in an extending manner.

In the embodiment, since the color filter 75 is buried in the concave portion 41, micro lenses may be omitted. Alternatively, in the embodiment, as noted with the chain lines, the micro lenses 37 may be formed on the planarization film 76.

Other configurations are the same as those described in the first embodiment. In FIG. 16, parts corresponding to those in FIG. 1 are shown by giving the same reference numerals thereto, and repeated description will be omitted.

Manufacturing Method Example of Solid-State Imaging Device

FIGS. 17A to 17D show a manufacturing method example of the solid-state imaging device 77 according to the sixth embodiment. The figures show only formation of the internal light collecting body of the active pixel region 24, and manufacturing processes of the other configurations including the optical black region are the same as those in the first embodiment, and thus description thereof will be omitted.

Figure 17A:
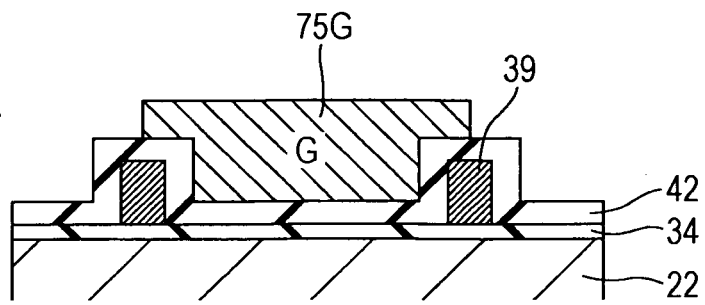
FIGS. 17A to 17D are manufacturing process diagrams of the main parts illustrating a manufacturing method example of the solid-state imaging device according to the sixth embodiment.

As shown in FIG. 17A, a planarization film 34 is formed on the rear surface of the semiconductor substrate 22 provided with the photodiodes PD so as to form the light blocking layer 39 which blocks light from entering between the pixels on the planarization film 34. As described above, the light blocking layer 39 is formed so as to surround each of the photodiodes PD and to form the concave portion 41 in the region corresponding to each of the photodiodes PD. Next, the first refractive index layer 42 having a relatively low refractive index is formed on the entire surfaces of the light blocking layer 39 and the concave portions 41.

Next, a first color, for example, a green color filter 75G is formed on the first refractive index layer 42 using photolithography so as to be buried in the concave portion 41 corresponding to the first color.

Figure 17B:
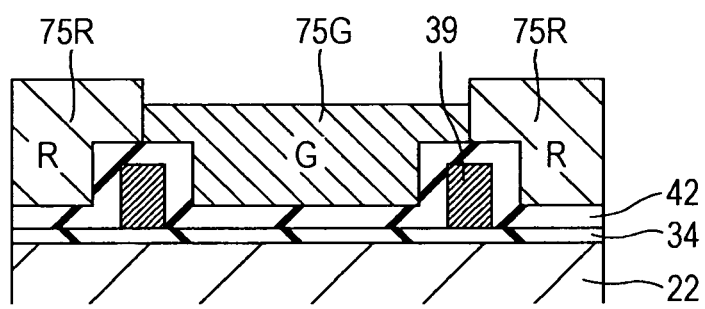

Next, as shown in FIG. 17B, a second color, for example, a red color filter 75R is formed using photolithography so as to be buried in the concave portion 41 corresponding to the second color. Thereafter, although not shown, a third color, for example, a blue color filter 75B is formed using photolithography so as to be buried in the concave portion 41 corresponding to the third color.

Figure 17C:
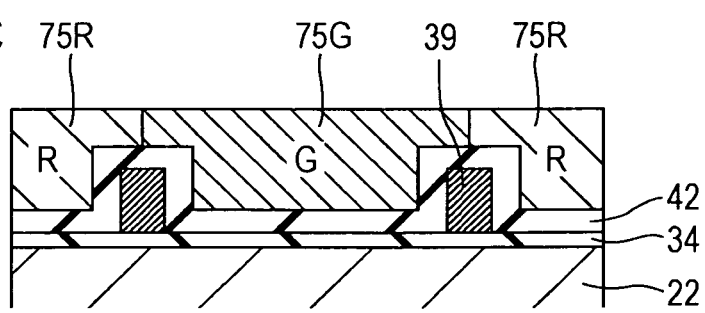

Next, as shown in FIG. 17C, the surface of the color filter 75 is planarized using etch-back or a CMP method. The surface of the color filter 75 is formed at a position to cover the upper surface of the first refractive index layer 42 on the light blocking layer 39. The color filter 75 is the second refractive index layer. Therefore, an internal light collecting body is formed by the light blocking layer 39, the first refractive index layer 42, and the color filter 75 having a refractive index higher than the first refractive index layer 42.

Figure 17D:
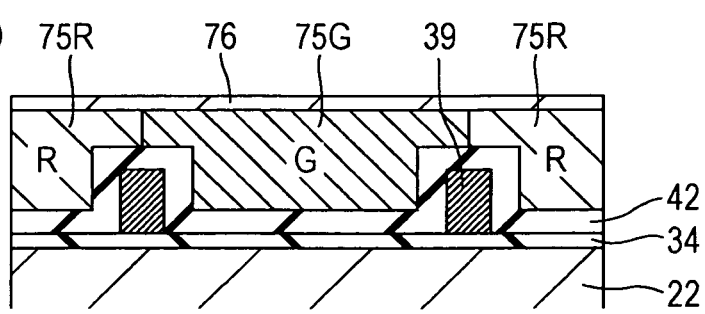

Next, as shown in FIG. 17D, the planarization film 76 having a low refractive index is formed on the surface of the color filter 75. In a case of forming micro lenses, the micro lenses 37 are formed on the planarization film 76.

Manufacturing processes of other configurations are the same as those described in the first embodiment. In this way, the desired solid-state imaging device 77 is obtained.

In the solid-state imaging device 77 according to the sixth embodiment, light incident to the color filter 75 is collected by the internal light collecting body formed by the light blocking layer 39, the first refractive index layer 42, and the color filter 75 which is the second refractive index layer and is incident to the photodiode PD. Therefore, the sensitivity characteristic in the solid-state imaging device 77 is improved, and the shading characteristic indicating a sensitivity difference between the center and the periphery in the active pixel region 24 can be improved.

In the embodiment, since the color filter 75 is buried in the concave portion 41, light can be incident to the photodiode PD of each pixel without causing color mixing even if micro lenses are not provided. The distance between the color filter 75 and the photodiode PD can be reduced, that is, thinning is achieved in the cross-sectional direction since the color filter 75 is buried in the concave portion 41, and thus it is possible to further improve the sensitivity characteristic accordingly. In addition, even in a case where the micro lenses 37 are provided, since the distance between the micro lenses 37 and the photodiode PD can be reduced, it is possible to further improve the sensitivity characteristic as compared with, for example, the first embodiment. By using the color filter 75 as the second refractive index layer, thinning is achieved in the cross-sectional direction, the problem occurring when the color filter is formed in the pixel portion is solved.

In the optical black region 25, since the anti-flare layer 44 is formed on the light blocking layer 39 using a photosensitive film via the first refractive index layer 42, adhesion of the anti-flare layer 44 is improved, and thus it is possible to form the anti-flare layer 44 having high reliability. Therefore, it is possible to provide a rear surface irradiation type CMOS solid-state imaging device with high image quality. In addition, the same effects described in the first embodiment are achieved.

Figure 18:
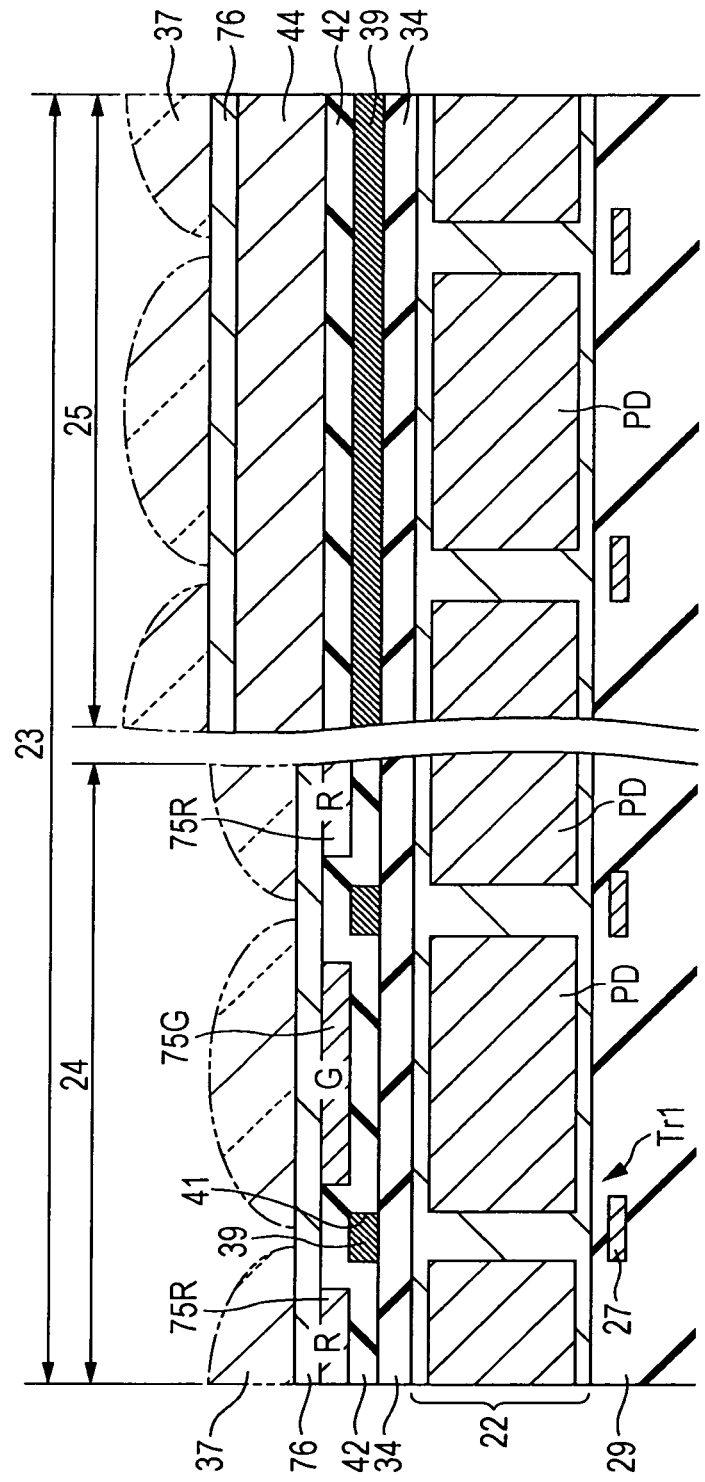
FIG. 18 is a schematic configuration diagram of main parts of a solid-state imaging device according to a modified example of the sixth embodiment.

Modified Example of Sixth Embodiment
Configuration Example of Solid-State Imaging Device FIG. 18 shows a solid-state imaging device according to the modified example of the sixth embodiment. In the solid-state imaging device 79 according to the modified example, the color filter 75 is buried in the concave portion 41 via the first refractive index layer 42 such that the upper surface thereof forms one surface with the upper surface of the first refractive index layer 42 on the light blocking layer 39.

Other configurations are the same as the solid-state imaging device 77 according to the sixth embodiment. In FIG. 18, parts corresponding to those in FIG. 16 are shown by giving the same reference numerals thereto, and repeated description will be omitted.

Manufacturing Method Example of Solid-State Imaging Device

Figure 19A:
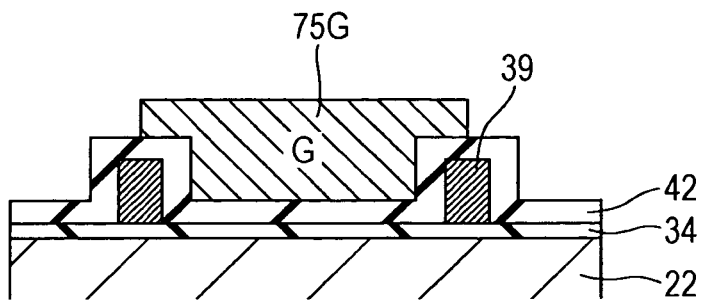
FIGS. 19A to 19D are manufacturing process diagrams of the main parts illustrating a manufacturing method example of the solid-state imaging device according to the modified example of the sixth embodiment.
Figure 19B:
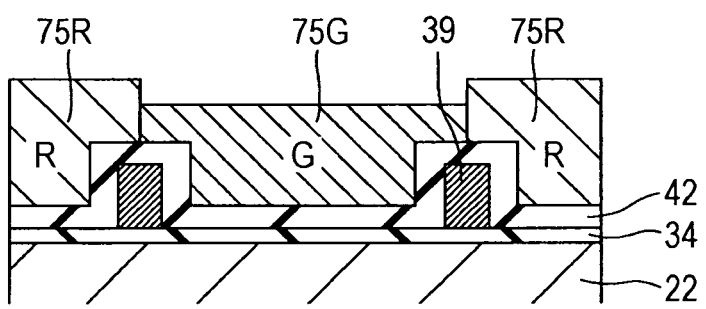

FIGS. 19A to 19D show a manufacturing method example of the solid-state imaging device 79 according to the modified example. In this example, the processes in FIGS. 19A and 19B are the same as the processes in FIGS. 17A and 17B.

Figure 19C:
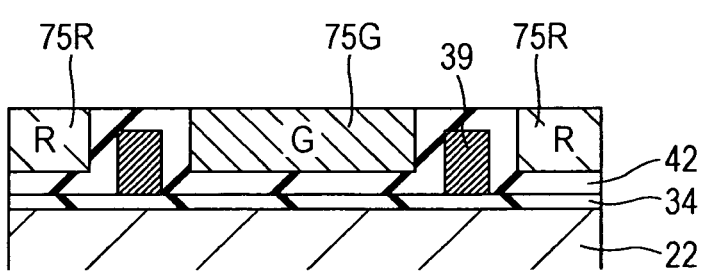

Next, as shown in FIG. 19C, the color filter 75 is planarized using etch-back or a CMP method such that the upper surface thereof forms one surface with the upper surface of the first refractive index layer 42 on the light blocking layer 39.

Figure 19D:
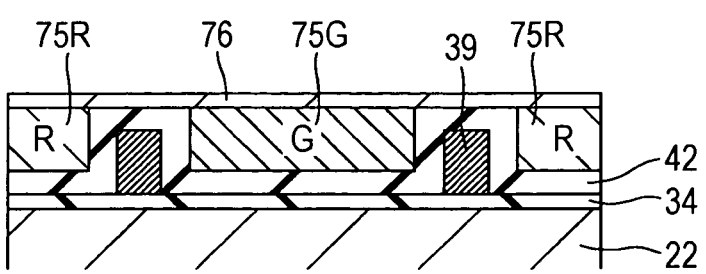

Thereafter, as shown in FIG. 19D, the planarization film 76 having a low refractive index is formed on the surface of the color filter 75. In a case of forming micro lenses, the micro lenses 37 are formed on the planarization film 76.

Manufacturing processes of other configurations are the same as those described in the first embodiment. In this way, the desired solid-state imaging device 79 is obtained.

In the solid-state imaging device 79 according to the modified example, the color filter 75 is formed such that the upper surface thereof forms one surface with the upper surface of the first refractive index layer 42 on the light blocking layer 39. Thereby, the distance between the color filter 75 and the photodiode PD can be reduced more than that in the solid-state imaging device 77 according to the sixth embodiment, and thus it is possible to further improve the sensitivity characteristic. In addition, the same effects described in the sixth embodiment are achieved.

7. Seventh Embodiment

Configuration Example of Solid-State Imaging Device

Figure 20:
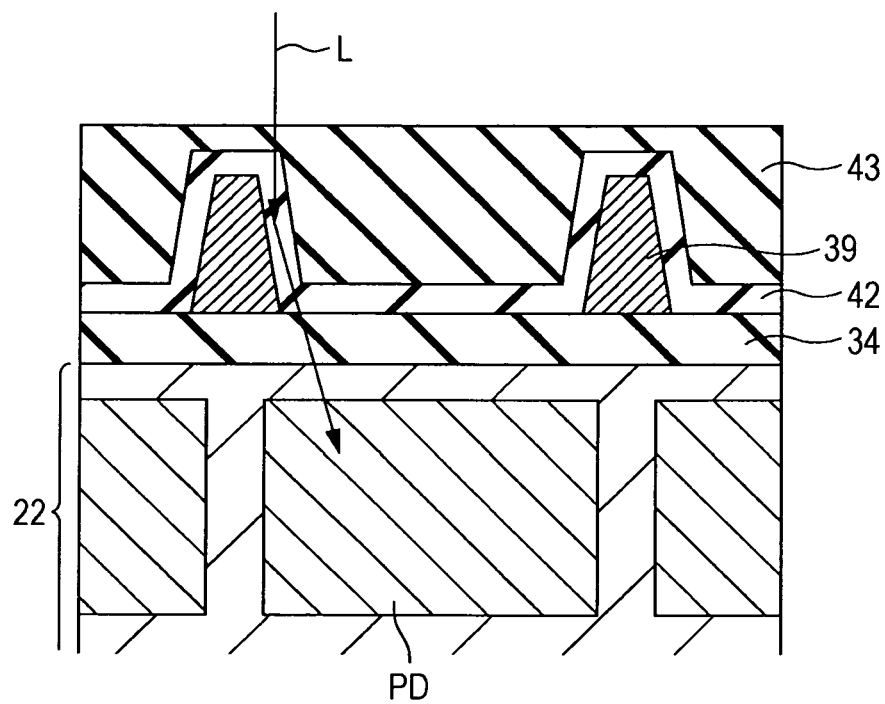
FIG. 20 is a schematic configuration diagram of main parts of a solid-state imaging device according to a seventh embodiment of the present disclosure.

FIG. 20 shows a solid-state imaging device according to a seventh embodiment of the present disclosure. The solid-state imaging device according to the embodiment employs a rear surface irradiation type CMOS solid-state imaging device. FIG. 20 shows only main parts of an internal light collecting body in the active pixel region 24. In the solid-state imaging device 81 according to the seventh embodiment, a cross-sectional shape of the light blocking layer 39 in the active pixel region 24 is formed in a tapered shape such that the width of the cross-section is gradually increased in the incident direction of light (from the upper side to the bottom). In FIG. 20, an internal light collecting body is formed by the light blocking layer 39 of which the cross-section has a tapered shape, the first refractive index layer 42, and the second refractive index layer 43.

Other configurations including the optical black region are the same as the configurations described in the above respective embodiments, or configurations described in embodiments described later, and repeated description thereof will be omitted.

In the solid-state imaging device 81 according to the seventh embodiment, since the cross-sectional shape of the light blocking layer 39 in the active pixel region 24 is formed to be tapered, it is possible to reduce an amount of incident light L blocked by the upper surface corners of the light blocking layer 39. In addition, the lateral surfaces of the light blocking layer 39 are tilted, and thus light reflected by the lateral surfaces of the light blocking layer 39 can be efficiently guided to the photodiode PD.

In addition, if the light blocking layer 39 according to the embodiment is applied to the above-described embodiments or embodiments described later, the same effects described in this embodiment are achieved.

8. Eighth Embodiment

Configuration Example of Solid-State Imaging Device

Figure 21:
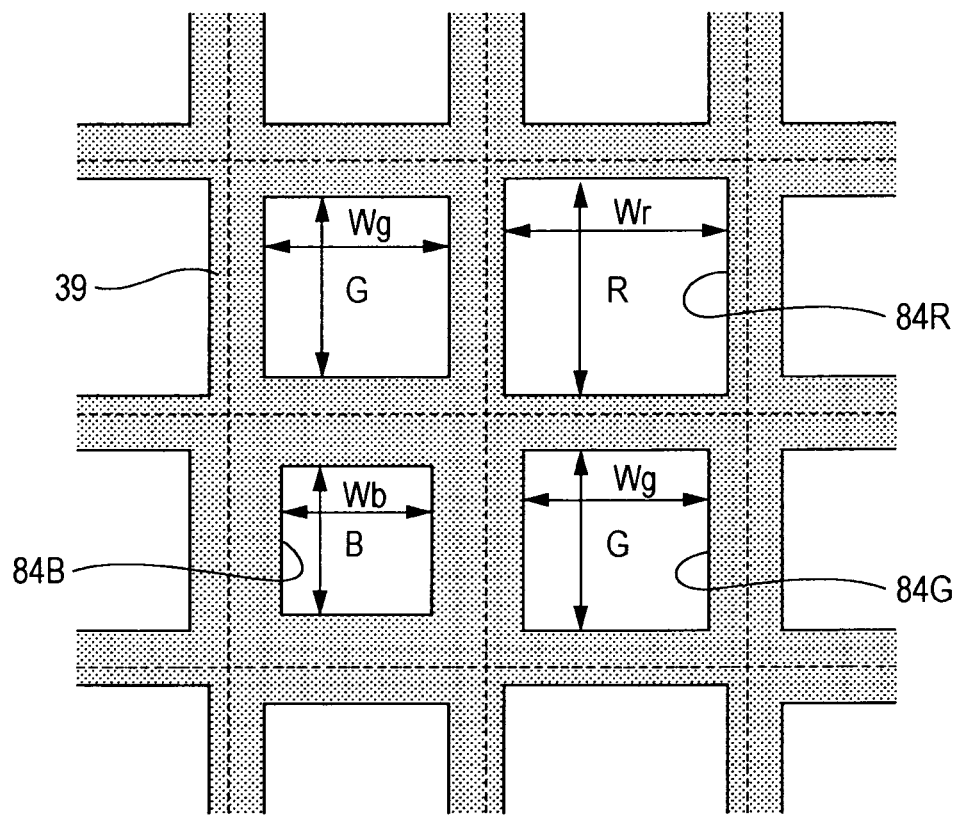
FIG. 21 is a schematic configuration diagram of main parts of a solid-state imaging device according to an eighth embodiment of the present disclosure.

FIG. 21 shows a solid-state imaging device according to an eighth embodiment of the present disclosure. The solid-state imaging device according to the embodiment employs a rear surface irradiation type CMOS solid-state imaging device. FIG. 21 shows only main parts of an internal light collecting body in the active pixel region 24, particularly, a configuration viewed from the upper surface of the light blocking layer 39. In the solid-state imaging device 83 according to the eight embodiment, opening areas corresponding to the respective color pixels of the light blocking layer 39 forming an internal light collecting body in the active pixel region 24 are different from each other.

In the embodiment, the opening size of the light blocking layer 39 is optimized for the color of each pixel. In other words, for example, since red light having a long wavelength is hard to deflect, the area of the opening 84R of the light blocking layer 39 is increased, and thus light which is originally incident to outside of the pixel is efficiently collected. The area of the opening 84G corresponding to the green pixel of the light blocking layer 39 is smaller than the area of the opening 84R corresponding to the red pixel, and thus light is further collected at the center of the green pixel, thereby reducing occurrence of color mixing. The area of the opening 84B corresponding to the blue pixel which senses blue light having a short wavelength is smaller than the area of the opening 84G corresponding to the green pixel, and thus light is further collected at the center of the blue pixel, thereby reducing occurrence of color mixing. Here, the opening areas of the light blocking layer 39 corresponding to the respective color pixels may be respectively defined by the opening widths Wr, Wg, and Wb shown in FIG. 21.

The light blocking layer 39 according to the embodiment may be applied to the above-described respective embodiments. Therefore, other configurations including the optical black region are the same as the configurations described in the respective embodiments, and repeated description thereof will be omitted.

In the solid-state imaging device 83 according to the eighth embodiment, the opening areas of the light blocking layer 39, that is, the opening widths are different from each other for the respective colors, and thus it is possible to efficiently collect light or to reduce color mixing according to incident wavelength light.

In addition, if the light blocking layer 39 according to the embodiment is applied to the above-described first to seventh embodiments, the same effects described in this embodiment are achieved.

Figure 22A:
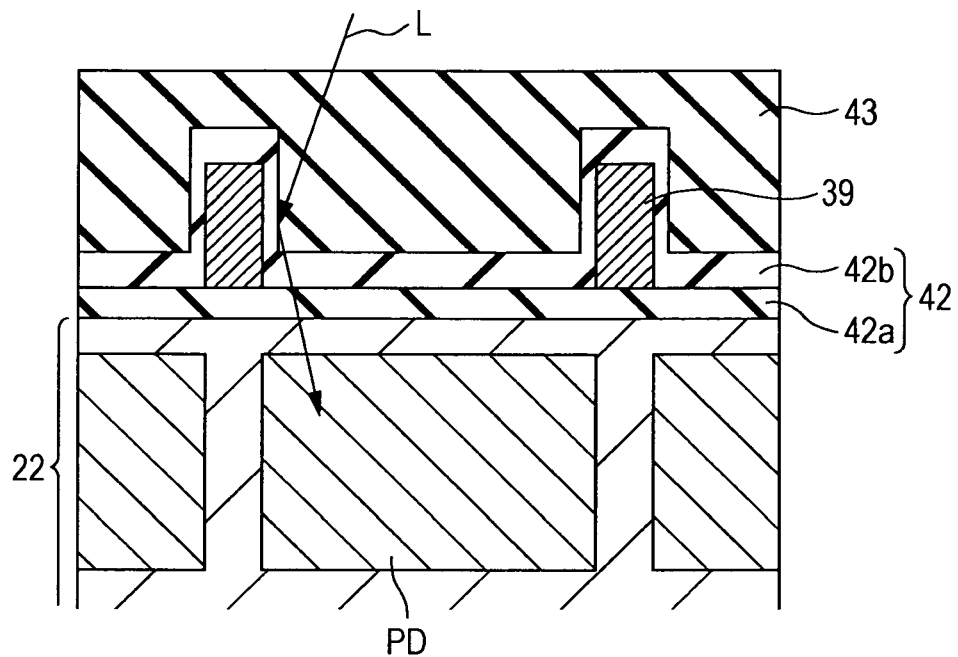
FIGS. 22A to 22B are configuration diagrams of main parts of an internal light collecting body according to a modified example.
Figure 22B:
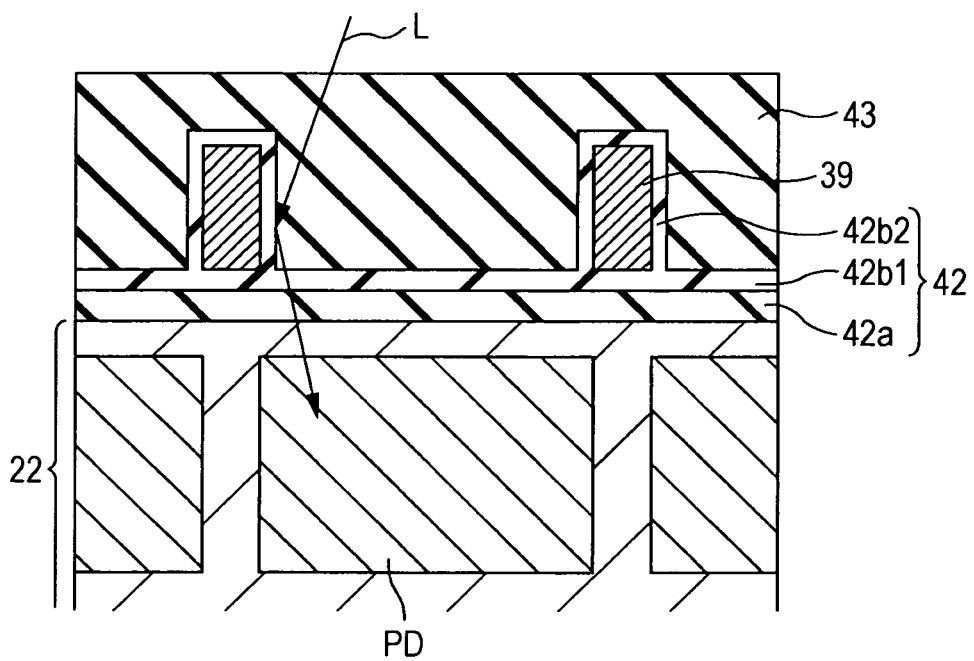

FIGS. 22A and 22B show the internal light collecting body, particularly, a modified example of the first refractive index layer 42 thereof.

In a configuration shown in FIG. 22A, a first film 42a constituting the first refractive index layer 42 is formed on the rear surface of the semiconductor substrate 22 in the active pixel region 24. In other words, the light blocking layer 39 surrounding the photodiode PD is formed on the first film 42a. In addition, a second film 42b constituting the first refractive index layer 42 is formed on the entire surfaces of the first layer 42a and the light blocking layer 39, and the second refractive index layer 43 is formed on the second film 42b, thereby forming an internal light collecting body. The first refractive index layer 42 is formed of the two-layer films 42a and 42b. The two-layer films 42a and 42b are formed using a material film which functions as an anti-reflection film. In terms of a relationship between refractive indices, the first refractive index layer 42 is a constituent element of the internal light collecting body and also functions as an anti-reflection film.

In a configuration shown in FIG. 22B, the first refractive index layer 42 is formed of two-layer films of a first film 42a and a second film 42b. In this example, the second film 42b of the first refractive index layer 42 is divided into two and is formed. That is to say, the first film 42a constituting the first refractive index layer 42 is formed on the rear surface of the semiconductor substrate 22 in the active pixel region 24. A second film 42b1 constituting the first refractive index layer 42 is formed on the first film 42a, and the light blocking layer 39 surrounding the photodiode PD is formed on the second film 42b1. A second film 42b2 of the first refractive index layer 42 is formed so as to cover the light blocking layer 39, and the second refractive index layer 43 is formed on the second films 42b1 and 42b2, thereby forming an internal light collecting body. In this example as well, the first refractive index layer 42 is a constituent element of the internal light collecting body and also functions as an anti-reflection film.

Figure 23A:
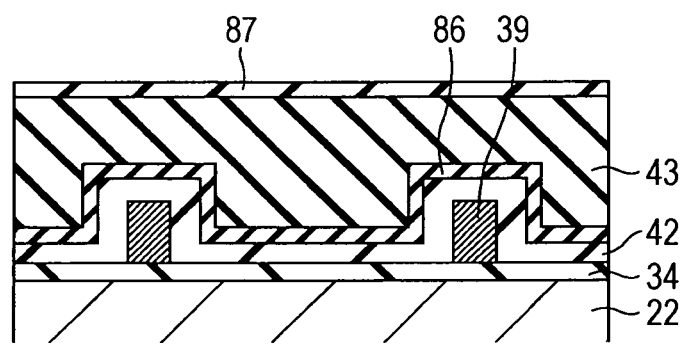
FIGS. 23A and 23B are configuration diagrams of main parts of a solid-state imaging device according to a modified example.
Figure 23B:
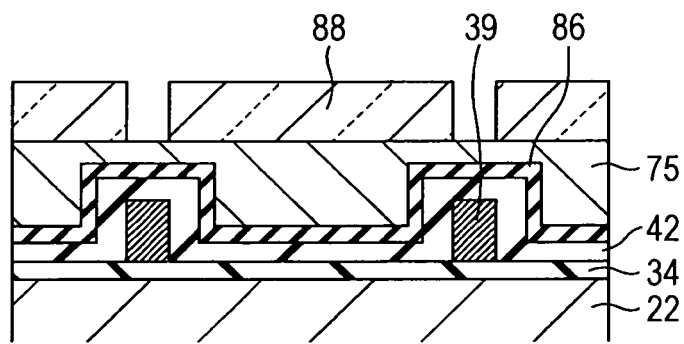

FIGS. 23A and 23B show a modified example of the rear surface irradiation type CMOS solid-state imaging device according to an embodiment of the present disclosure.

In the example shown in FIG. 23A, a first anti-reflection film 86 is formed between the first refractive index layer 42 and the second refractive index layer 43 forming an internal light collecting body, and a second anti-reflection film 87 is formed on the second refractive index layer 43. Color filters are formed on the second anti-reflection film 87. The magnitude correlation of the refractive index is the first refractive index layer 42<the first anti-reflection film 86<the second refractive index layer 43. In a case where a silicon oxide film (refractive index≅about 1.45) is used as the first refractive index layer 42, and a silicon oxide film (refractive index≅about 1.9 to 2.0) is used as the second refractive index layer 43, for example, a silicon oxide nitride film (refractive index≅about 1.6 to 2.0 below) is preferably used as the anti-reflection film 86.

In addition, the magnitude correlation of the refractive index is the second refractive index layer 43>the second anti-reflection film 87>the color filter. For example, in a case where a silicon nitride film (refractive index≅about 1.9 to 2.0) is used as the second refractive index layer 43, and the color filter (refractive index≅about 1.6 to 1.7) is formed thereon, the following material films may be used as the intermediate anti-reflection film 87. An acrylic resin (refractive index≅about 1.5), a silicon oxide film (refractive index≅about 1.45), or the like may be used.

In the example shown in FIG. 23B, micro lenses 88 of which the cross-section has a rectangular shape are formed on the color filter 75 which is the second refractive index layer on the first refractive index layer 42.

9. Ninth Embodiment

Configuration Example of Solid-State Imaging Device

Figure 24:
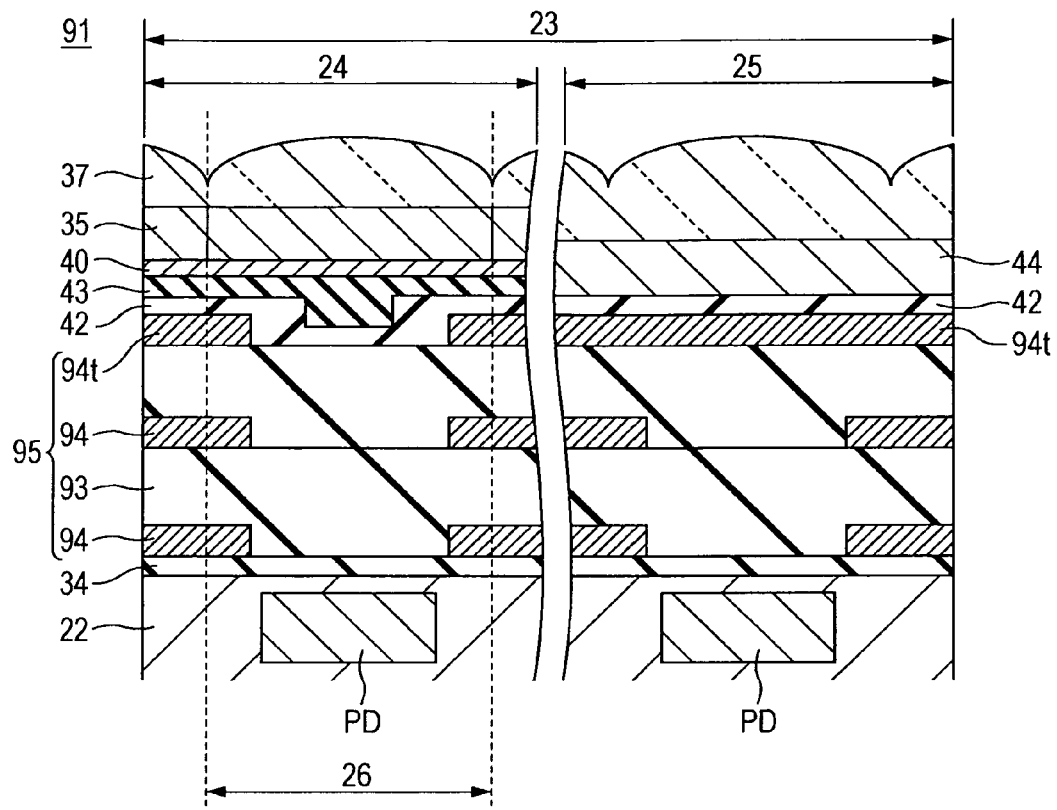
FIG. 24 is a schematic configuration diagram of main parts of a solid-state imaging device according to a ninth embodiment of the present disclosure.

FIG. 24 shows a solid-state imaging device according to a ninth embodiment of the present disclosure. The solid-state imaging device according to the embodiment employs a rear surface irradiation type CMOS solid-state imaging device. The solid-state imaging device 91 according to the ninth embodiment is formed by arranging the unit pixel including a photodiode PD and a plurality of pixel transistors on a semiconductor substrate 92 in the pixel region 23. A multi-layer wire layer 95 where a plurality of wire layers 94 are disposed is formed on the front surface of the semiconductor substrate 92 via an interlayer insulating film 93. The uppermost wire 94t is also used as a light blocking layer.

In an active pixel region 24, the wire 94t which is a light blocking layer is formed in a lattice shape so as to surround the photodiode PD. A first refractive index layer 42 is formed on the upper surface of the multi-layer wire layer 95 including the uppermost wire 94t, and a second refractive index layer 43 is formed on the first refractive index layer 42 so as to be buried in the concave portion 41. In addition, color filters 35 and micro lenses 37 are formed on the planarized upper surface of the second refractive index layer 43. An internal light collecting body is formed by the wire 94t which is a light blocking layer, the first refractive index layer 42, and the second refractive index layer 43.

On the other hand, in an optical black region 25, the wire 94t which is a light blocking layer is formed on the entire surface of the optical black region 25. The first refractive index layer 42 is formed on the wire 94t which is a light blocking layer in an extending manner, and an anti-flare layer 44 is formed on the first refractive index layer 42.

In the solid-state imaging device 91 according to the ninth embodiment, since the internal light collecting body formed by the wire 94t which is a light blocking layer, the first refractive index layer 42, and the second refractive index layer 43 is formed so as to correspond to each pixel in the active pixel region 24, the sensitivity characteristic and the shading characteristic are improved. In the optical black region 25, the anti-flare layer 44 having good adhesion is formed on the wire 94t which is a light blocking layer via the first refractive index layer 42. Therefore, it is possible to provide a rear surface irradiation type CMOS solid-state imaging device with high image quality.

10. Tenth Embodiment

Configuration Example of Solid-State Imaging Device

Figure 25:
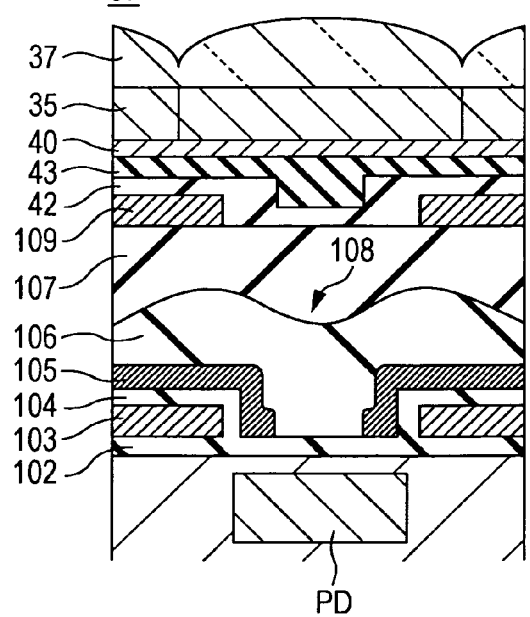
FIG. 25 is a schematic configuration diagram of main parts of a solid-state imaging device according to a tenth embodiment of the present disclosure.

FIG. 25 shows a solid-state imaging device according to a tenth embodiment of the present disclosure. The solid-state imaging device according to the embodiment employs a rear surface irradiation type CMOS solid-state imaging device. The solid-state imaging device 97 according to the tenth embodiment includes photodiodes PD arranged in a two-dimensional manner, and a vertical transmission register 101, a horizontal transmission register (not shown), and an output portion (not shown) for each photodiode line, in a pixel region of a semiconductor substrate 98. The vertical transmission register 101 is formed by forming a transmission electrode 103 on a transmission channel region via a gate insulating film 102. A light blocking layer 105 is formed so as to cover the transmission electrode 103 via an insulating film 104 except for the photodiode PD. In addition, an intra-layer lens 108 is formed of insulating films 106 and 107 of which refractive indices are different from each other, on the upper side corresponding to the photodiode PD.

In the embodiment, a light blocking layer 109 is formed in a lattice shape so as to surround the photodiode PD on the insulating film 107 in the active pixel region. The light blocking layer 109 is formed of a black organic film absorbing light and is also used as an anti-flare layer. A first refractive index layer 42 is formed on the surface including the light blocking layer 109, and a second refractive index layer 43 is formed on the first refractive index layer 42 so as to be buried a concave portion 41 corresponding to the photodiode PD. An internal light collecting body corresponding to each photodiode PD is formed by the light blocking layer 109, the first refractive index layer 42, and the second refractive index layer 43. In addition, color filters 35 and micro lenses 37 are formed on the upper surface of the second refractive index layer 43.

On the other hand, in the optical black region, although not shown, the light blocking layer 105 is formed on the entire surfaces of the transmission electrode 103 and the photodiode PD, and the light blocking layer 109 for preventing flare is formed on the entire surface of the overlying insulating film 107 which forms the intra-layer lens. In addition, in the optical black region, a metallic light blocking layer may be formed on the entire surface of the overlying insulating film 107 forming the intra-layer lens, and an anti-flare layer may be formed thereon via the first refractive index layer 42.

In the solid-state imaging device 97 according to the tenth embodiment, since the internal light collecting body formed by the light blocking layer 109 which is also used as an anti-flare layer, the first refractive index layer 42, and the second refractive index layer 43 is formed so as to correspond to each pixel in the active pixel region, the sensitivity characteristic and the shading characteristic are improved. In the optical black region, the light blocking layer 109 used as an anti-flare layer is formed on the entire surface. Therefore, it is possible to provide a rear surface irradiation type CMOS solid-state imaging device with high image quality. If a metallic light blocking layer is formed in the optical black region, and an anti-flare layer is formed thereon via the first refractive index layer, the anti-flare layer has good adhesion.

In the present disclosure, although not shown, the internal light collecting body in the active pixel region and the light blocking layer/the first refractive index layer/the anti-flare layer structure in the optical black region in the first to ninth embodiments are applicable to a rear surface irradiation type CCD solid-state imaging device.

In the above-described embodiments, the second refractive index layer may be planarized so as to be left on the first refractive index layer in the active pixel region 24, and accordingly the second refractive index layer may be left on the first refractive index layer in the optical black region 25 as well. In this case, in the optical black region 25, the anti-flare layer is formed on the second refractive index layer on the first refractive index layer.

11. Eleventh Embodiment

Configuration Example of Electronic Apparatus

The solid-state imaging device according to the embodiments of the present disclosure is applicable to electronic apparatuses such as, for example, a camera system such as a digital camera or a video camera, a mobile phone having an imaging function, or other apparatuses having an imaging function.

Figure 27:
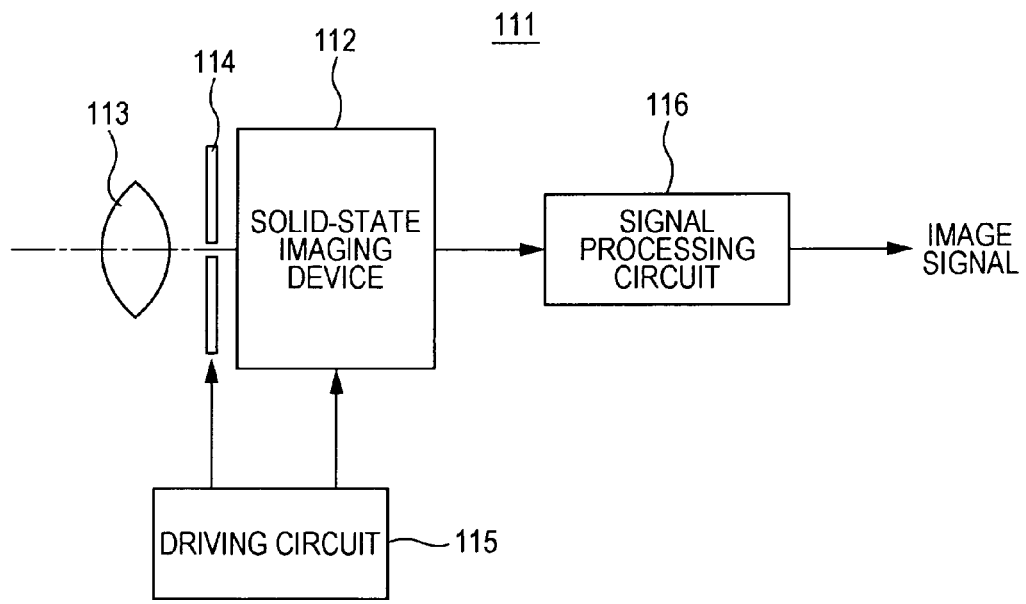
FIG. 27 is a schematic configuration diagram illustrating an electronic apparatus according to an eleventh embodiment of the present disclosure.
Figure 28:
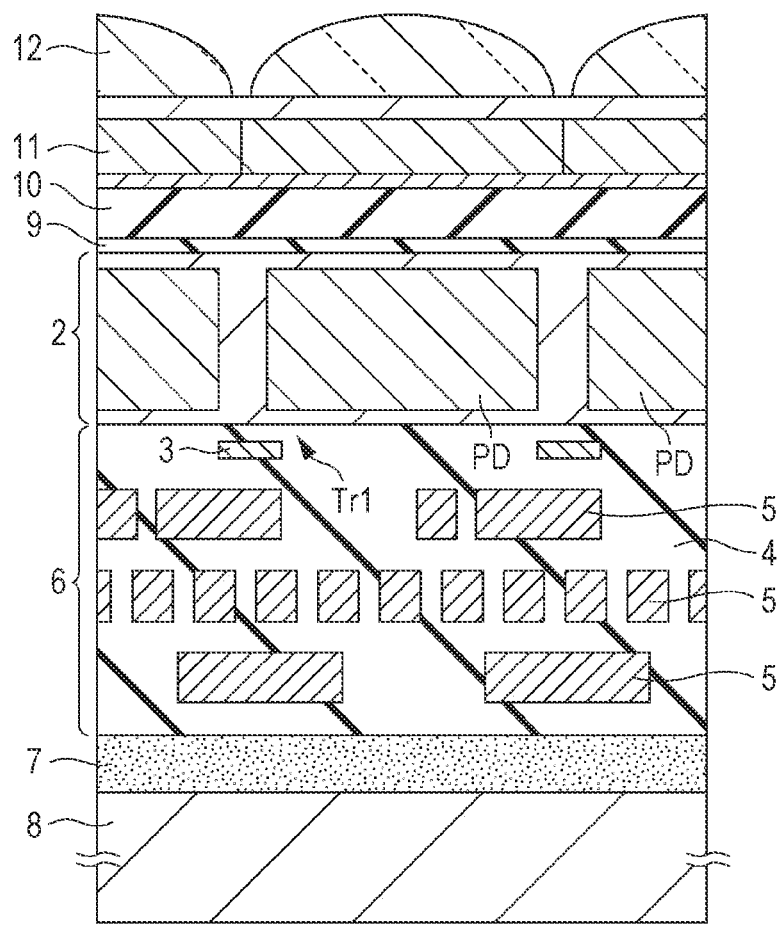
FIG. 28 is a schematic configuration diagram illustrating an example of the rear surface irradiation type CMOS solid-state imaging device in the related art.
Figure 29:
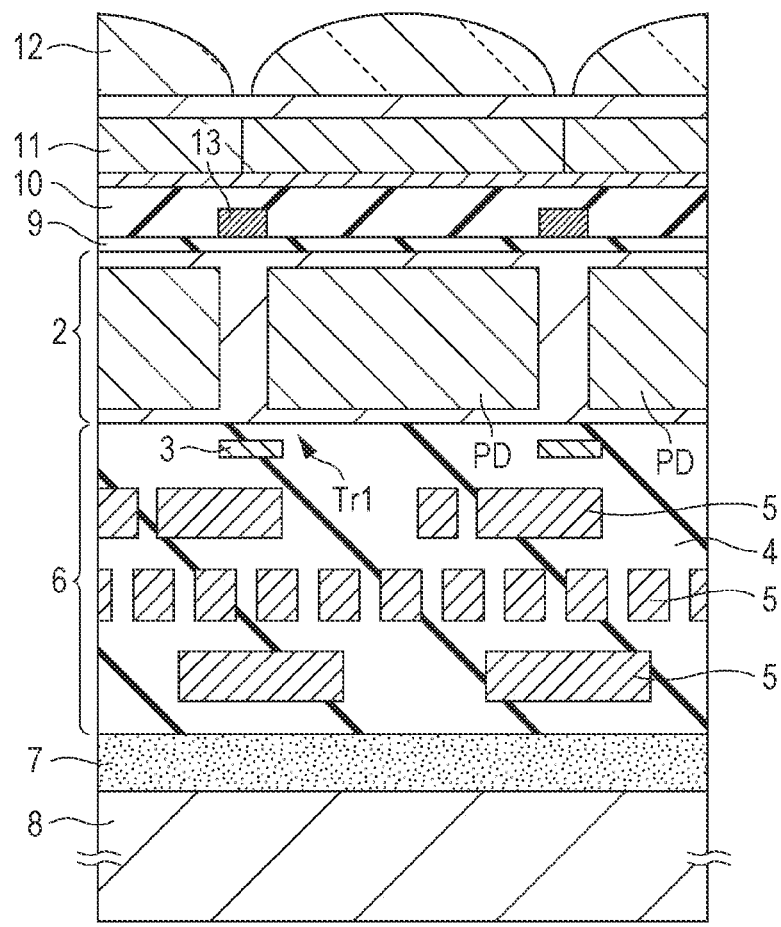
FIG. 29 is a schematic configuration diagram illustrating a rear surface irradiation type CMOS solid-state imaging device related to a reference example.
Figure 30:
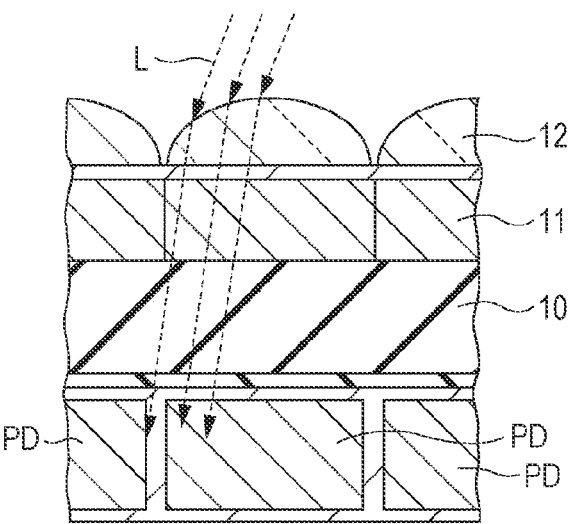
FIG. 30 is a diagram illustrating a light incidence state in a rear surface irradiation type CMOS solid-state imaging device having no light blocking layer between pixels.
Figure 31:
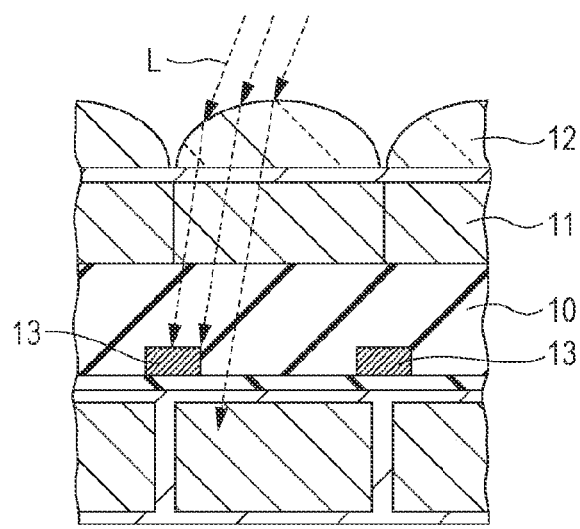
FIG. 31 is a diagram illustrating a light incidence state in a rear surface irradiation type CMOS solid-state imaging device having light blocking layer between pixels.
Figure 32:
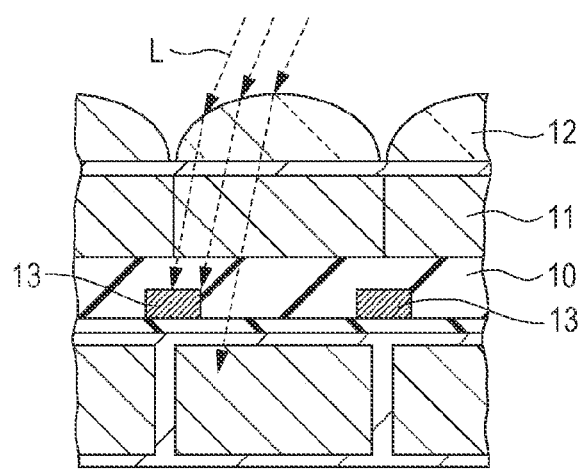
FIG. 32 is a diagram illustrating a light incidence state in another rear surface irradiation type CMOS solid-state imaging device having light blocking layer between pixels.

FIG. 27 shows a camera which is an example of the electronic apparatus, according to an eleventh embodiment of the present disclosure. The camera according to the embodiment is exemplified by a video camera capable of capturing still images or moving images. The camera 111 according to the embodiment includes a solid-state imaging device 112, an optical system 113 which guides incident light to a light sensing unit of the solid-state imaging device 112, and a shutter device 114. In addition, the camera 112 includes a driving circuit 115 which drives the solid-state imaging device 112, and a signal processing circuit 116 which processes an output signal from the solid-state imaging device 112.

The solid-state imaging device 112 employs any one of the solid-state imaging devices according to the above-described embodiments. The optical system (optical lens) 113 enables image light (incident light) from a subject to form an image on an imaging surface of the solid-state imaging device 112. Thereby, signal charge is accumulated in the solid-state imaging device 112 for a specific time. The optical system 113 may be an optical lens system constituted by a plurality of optical lenses. The shutter device 114 controls a light irradiation time period and a light blocking time period to the solid-state imaging device 112. The driving circuit 115 supplies driving signals for controlling a transmission operation of the solid-state imaging device 112 and a shutter operation of the shutter device 114. The solid-state imaging device 112 transmits signals in response to the driving signals (timing signals) supplied from the driving circuit 115. The signal processing circuit 116 performs a variety of signal processes. An image signal having undergone a signal process is stored in a storage medium such as a memory or is output to a monitor.

According to the electronic apparatus in the eleventh embodiment, in the solid-state imaging device, the sensitivity characteristic and the shading characteristic are improved in the active pixel region, and the anti-flare layer having good adhesion is formed on the light blocking layer via the first refractive index layer 42 in the optical black region 25. Therefore, it is possible to provide an electronic apparatus with high image quality. For example, it is possible to provide a camera or the like where image quality is improved.

The present disclosure contains subject matter related to that disclosed in Japanese Priority Patent Application JP 2010-274895 filed in the Japan Patent Office on Dec. 9, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging device comprising:
   a light blocking layer that is formed in an active pixel region of a pixel region on a light incident side so as to surround a photoelectric conversion unit of each pixel and is formed in an extending manner to an optical black region;
   a concave portion that is formed so as to be surrounded by the light blocking layer in a region corresponding to the photoelectric conversion unit;
   a first refractive index layer that is formed on surfaces of the light blocking layer and the concave portion and has a relatively low refractive index;
   a second refractive index layer that is formed on the first refractive index layer so as to be buried in the concave portion and has a relatively high refractive index; and
   an anti-flare layer that is formed on the first refractive index layer in the optical black region,
   wherein an internal light collecting body is formed by the light blocking layer, the first refractive index layer, and the second refractive index layer in the active pixel region,
   wherein both the light blocking layer and the anti-flare layer are present in at least a portion of the optical black region.

2. The solid-state imaging device according to claim 1, wherein the light blocking layer is formed in a tapered shape such that a width of the cross-section is increased in a light incident direction.

3. The solid-state imaging device according to claim 1, wherein opening widths of the light blocking layer are different from each other for respective colors.

4. The solid-state imaging device according to claim 1, further comprising a third refractive index layer that has a refractive index higher than the second refractive index layer and is formed on the second refractive index layer,
   wherein an intra-layer lens is formed by the second refractive index layer and the third refractive index layer.

5. The solid-state imaging device according to claim 1, further comprising a color filter formed on the second refractive index layer in the active pixel region.

6. The solid-state imaging device according to claim 5, wherein the pixels include the photoelectric conversion unit and a plurality of pixel transistors,
   wherein the pixel transistors are formed on a front surface of a semiconductor substrate,
   wherein the photoelectric conversion unit is formed from the front surface of the semiconductor substrate to a rear surface thereof, and
   wherein the solid-state imaging device is configured by a rear surface irradiation type where light is incident from the rear surface of the semiconductor substrate.

7. The solid-state imaging device according to claim 1, wherein the second refractive index layer is formed of a color filter.

8. The solid-state imaging device according to claim 1, wherein
   in at least the portion of the optical black region, the first refractive index layer is disposed between the light blocking layer and the anti-flare layer.

9. The solid-state imaging device according to claim 1, wherein the anti-flare layer includes a photosensitive film.

10. A manufacturing method of a solid-state imaging device comprising:
    forming a light blocking layer in an active pixel region of a pixel region in a light incident side so as to surround a photoelectric conversion unit of each pixel and in an extending manner to an optical black region;
    forming a concave portion so as to be surrounded by the light blocking layer in a region corresponding to the photoelectric conversion unit;
    forming a first refractive index layer having a relatively low refractive index on surfaces of the light blocking layer and the concave portion;
    forming a second refractive index layer having a relatively high refractive index on the first refractive index layer so as to be buried in the concave portion; and
    forming an anti-flare layer on the first refractive index layer in the optical black region,
    wherein an internal light collecting body is formed by the light blocking layer, the first refractive index layer, and the second refractive index layer in the active pixel region,
    wherein both the light blocking layer and the anti-flare layer are present in at least a portion of the optical black region.

11. The manufacturing method of the solid-state imaging device according to claim 10, wherein the light blocking layer is formed in a tapered shape such that a width of the cross-section is increased in a light incident direction.

12. The manufacturing method of the solid-state imaging device according to claim 10, wherein opening widths of the light blocking layer are different from each other for respective colors.

13. The manufacturing method of the solid-state imaging device according to claim 10, further comprising forming a third refractive index layer having a refractive index higher than the second refractive index layer on the second refractive index layer, wherein an intra-layer lens is formed by the second refractive index layer and the third refractive index layer.

14. The manufacturing method of the solid-state imaging device according to claim 10, further comprising forming a color filter on the second refractive index layer in the active pixel region.

15. The manufacturing method of the solid-state imaging device according to claim 14, wherein the pixels are formed by the photoelectric conversion unit and a plurality of pixel transistors,
   wherein the pixel transistors are formed on a front surface of a semiconductor substrate,
   wherein the photoelectric conversion unit is formed from the front surface of the semiconductor substrate to a rear surface thereof, and
   wherein the solid-state imaging device is configured by a rear surface irradiation type where light is incident from the rear surface of the semiconductor substrate.

16. The manufacturing method of the solid-state imaging device according to claim 10, wherein the second refractive index layer is formed of a color filter.

17. The manufacturing method of the solid-state imaging device according to claim 10, wherein
   in at least the portion of the optical black region, the first refractive index layer is disposed between the light blocking layer and the anti-flare layer.

18. The manufacturing method of the solid-state imaging device according to claim 10, wherein the anti-flare layer includes a photosensitive film.

19. An electronic apparatus comprising:
   a solid-state imaging device;
   an optical system that guides incident light to a photoelectric conversion unit of the solid-state imaging device; and
   a signal processing circuit that processes an output signal from the solid-state imaging device,
   wherein the solid-state imaging device is the solid-state imaging device according to claim 1.

* * * * *